(12) United States Patent
Kobayashi et al.

(10) Patent No.: US 7,514,772 B2
(45) Date of Patent: Apr. 7, 2009

(54) METHOD OF MANUFACTURING A SEMICONDUCTOR APPARATUS

(75) Inventors: Tomoki Kobayashi, Nagano (JP); Toshiji Shimada, Nagano (JP); Akinobu Inoue, Nagano (JP); Atsunori Kajiki, Nagano (JP); Hiroyuki Kato, Nagano (JP); Hiroshi Shimizu, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 211 days.

(21) Appl. No.: 11/380,128

(22) Filed: Apr. 25, 2006

(65) Prior Publication Data

US 2006/0244131 A1    Nov. 2, 2006

(30) Foreign Application Priority Data

Apr. 28, 2005    (JP) .............................. 2005-132539

(51) Int. Cl.
*H01L 23/02* (2006.01)

(52) U.S. Cl. ........................................ 257/686; 257/783

(58) Field of Classification Search ................. 257/783, 257/686, 707
See application file for complete search history.

(56) References Cited

U.S. PATENT DOCUMENTS

| | | | |
|---|---|---|---|
| 5,903,049 A * | 5/1999 | Mori | ........................... 257/686 |
| 2002/0012869 A1 | 1/2002 | Adams et al. | |
| 2002/0017710 A1* | 2/2002 | Kurashima et al. | .......... 257/686 |
| 2002/0148733 A1 | 10/2002 | Saito et al. | |
| 2002/0153582 A1 | 10/2002 | Takehara et al. | |

FOREIGN PATENT DOCUMENTS

| | | |
|---|---|---|
| DE | 196 06 862 | 8/1996 |
| JP | 2002-280468 | 9/2002 |
| WO | 01/19607 | 3/2001 |

* cited by examiner

*Primary Examiner*—Phat X Cao
(74) *Attorney, Agent, or Firm*—Rankin, Hill & Clark LLP

(57) ABSTRACT

A resin layer in which adhesion to a conductive film is higher than that of a sealing resin to the conductive film is disposed on the sealing resin in which it is difficult to form the conductive film, and wiring patterns electrically connected to electronic components are disposed on the resin layer.

5 Claims, 21 Drawing Sheets

METHOD OF MANUFACTURING A SEMICONDUCTOR APPARATUS

The present application claims foreign priority based on Japanese Patent Application No. 2005-132539, filed Apr. 28, 2005, the content of which is incorporated herein by reference.

BACKGROUND OF THE INVENTION

1. Technical Field

The present invention relates to a semiconductor apparatus and a manufacturing method thereof, and particularly to a semiconductor apparatus comprising a sealing resin for sealing an electronic component and a manufacturing method thereof.

2. Related Art

A related-art semiconductor apparatus includes a sealing resin for sealing an electronic component mounted on a substrate and a shielding layer for protecting the electronic component from electromagnetic waves on the sealing resin.

FIG. 42 is a perspective view of a related-art semiconductor apparatus comprising a shielding layer and a sealing resin for sealing electronic components. In FIG. 42, a part of a shielding layer 105 and a sealing resin 104 are notched and illustrated for ease in understanding a configuration of a semiconductor apparatus 100.

As shown in FIG. 42, the semiconductor apparatus 100 has a substrate 101, electronic components 102, the sealing resin 104 and the shielding layer 105.

The electronic components 102 are mounted on the substrate 101. The electronic components 102 are, for example, a high-frequency semiconductor element, a chip resistor or a chip capacitor. The sealing resin 104 protects the electronic components 102 from a shock etc. from the outside. The sealing resin 104 is disposed so as to cover the electronic components 102. The sealing resin 104 has good shock resistance and durability and the surface is formed in a smooth surface.

The shielding layer 105 is directly disposed on the sealing resin 104 so as to cover an upper surface of the sealing resin 104. As the shielding layer 105, a conductive film (metal film) formed by, for example, a sputtering method, a vacuum evaporation method or a plating method can be used. The shielding layer 105 protects the electronic components 102 from electromagnetic waves by shielding the electromagnetic waves from the outside (for example, see Japanese Patent Publication: JP-A-2002-280468).

However, the sealing resin 104 has good shock resistance and durability, so that it is difficult to roughen its surface. As a result of this, adhesion between the sealing resin 104 and a conductive film formed by a sputtering method, a vacuum evaporation method, a plating method, etc. is bad, and it was difficult to directly form a wiring pattern or the shielding layer 105 made of the conductive film on the sealing resin 104.

Also, in the related-art semiconductor apparatus 100, the shielding layer 105 is not disposed in a side surface of the sealing resin 104, so that there was a problem that electrical characteristics of the electronic components 102 reduce because of electromagnetic waves intruding from the side surface of the sealing resin 104.

Further, there was a problem that a mounting density of the semiconductor apparatus 100 must be improved as performance of electronic equipment of recent years becomes higher.

SUMMARY OF THE INVENTION

The disclosure below describes a semiconductor apparatus capable of improving a mounting density and blocking electromagnetic waves with high accuracy, and a manufacturing method of the semiconductor apparatus.

In one aspect, the disclosure describes a semiconductor apparatus comprising: a substrate; an electronic component mounted on the substrate; a sealing resin for sealing the electronic component; a resin layer, in which adhesion to a conductive film is higher than that of the sealing resin to the conductive film, disposed on the sealing resin; and a conductive pattern electrically connected to the electronic component and disposed on the resin layer.

By disposing a resin layer in which adhesion to a conductive film is higher than that of a sealing resin to the conductive film on the sealing resin in which it is difficult to form the conductive film, a conductive pattern can be disposed on the resin layer and a mounting density of a semiconductor apparatus can be improved.

Herein, the conductive pattern includes a wiring pattern or antenna.

Also, in the configuration described above, the conductive pattern may have a connection part for connecting other electronic component. By disposing the connection part in the conductive pattern, the other electronic component is mounted in the connection part and the mounting density can be improved further.

In another aspect, the disclosure describes a semiconductor apparatus comprising: a substrate; a ground terminal formed on the substrate; an electronic component mounted on the substrate; a sealing resin for sealing the electronic component; a resin layer, in which adhesion to a conductive film is higher than that of the sealing resin to the conductive film, disposed on the sealing resin; and a shielding layer electrically connected to the ground terminal and disposed on the resin layer.

By disposing a resin layer in which adhesion to a conductive film is higher than that of a sealing resin to the conductive film on the sealing resin in which it is difficult to form the conductive film, a shielding layer can be disposed on the resin layer.

Also, in the configuration described above, the resin layer may be disposed so as to continuously cover an upper surface and a side surface of the sealing resin and the shielding layer may be disposed so as to cover the resin layer. By disposing the shielding layer so as to surround the upper surface and the side surface of the sealing resin thus, electromagnetic waves can be blocked with high accuracy.

In other aspect, the disclosure describes a manufacturing method of a semiconductor apparatus comprising a substrate, an electronic component mounted on the substrate, and a sealing resin for sealing the electronic component, comprising: a resin layer formation step of forming a resin layer in which adhesion to a conductive film is higher than that of the sealing resin to the conductive film on the sealing resin; and a conductive pattern formation step of forming a conductive pattern on the resin layer.

By disposing a resin layer formation step of forming a resin layer in which adhesion to a conductive film is higher than that of a sealing resin to the conductive film on the sealing resin in which it is difficult to form the conductive film, a conductive pattern can be formed on the resin layer.

Herein, the conductive pattern includes a wiring pattern or antenna.

In other aspect, the disclosure describes a manufacturing method of a semiconductor apparatus comprising a substrate, a ground terminal formed on the substrate, an electronic component mounted on the substrate, and a sealing resin for sealing the electronic component, comprising a resin layer formation step of forming a resin layer in which adhesion to a conductive film is higher than that of the sealing resin to the conductive film on the sealing resin, and a shielding layer formation step of forming a shielding layer electrically connected to the ground terminal on the resin layer.

By disposing a resin layer formation step of forming a resin layer in which adhesion to a conductive film is higher than that of a sealing resin to the conductive film on the sealing resin in which it is difficult to form the conductive film, a shielding layer can be formed on the resin layer.

One or more of the following advantages may be present in some implementations. For example, a mounting density can be improved and electromagnetic waves can be blocked with high accuracy.

DETAILED DESCRIPTION OF THE INVENTION

Next, embodiments of the invention will be described based on the drawings.

First Embodiment

Figure 1:
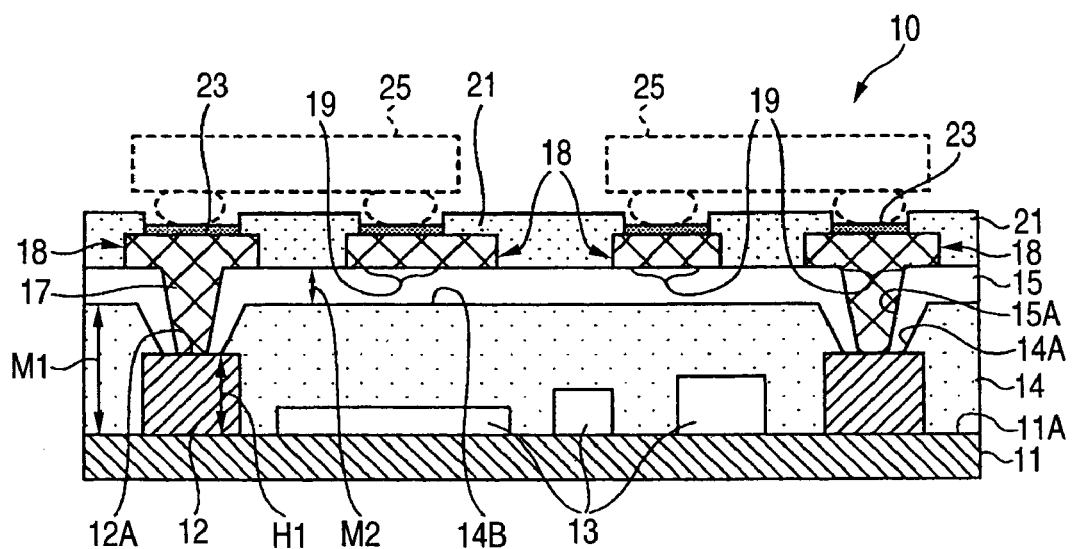
FIG. 1 is a sectional view of a semiconductor apparatus according to a first exemplary, non-limiting embodiment of the invention.

FIG. 1 is a sectional view of a semiconductor apparatus according to a first exemplary, non-limiting embodiment of the invention. In FIG. 1, H1 shows a height (hereinafter called "height H1") of a terminal 12 for via connection, and M1 shows a thickness (hereinafter called "thickness M1") of a sealing resin 14 in the case of using an upper surface 11A of a substrate 11 as the reference, and M2 shows a thickness (hereinafter called "thickness M2") of a resin layer 15, respectively.

First, a semiconductor apparatus 10 according to the exemplary, non-limiting embodiment of the invention will be described with reference to FIG. 1. The semiconductor apparatus 10 has the substrate 11, the terminal 12 for via connection, electronic components 13, the sealing resin 14, the resin layer 15, a via 17, a wiring pattern 18, a protective film 21 and a diffusion preventive film 23.

The substrate 11 electrically connects the electronic components 13 to other substrates (not shown) such as a motherboard. As the substrate 11, for example, a printed wiring board can be used.

The terminal 12 for via connection is disposed on the substrate 11 and is electrically connected to the electronic components 13 by wiring (not shown). Also, an upper surface 12A of the terminal 12 for via connection is connected to the via 17. The terminal 12 for via connection can be formed by, for example, precipitating a Cu plated film on wiring of the substrate 11 in column shape or installing a columnar copper material.

Also, the height H1 of the terminal 12 for via connection could be heightened (where H1<M1). By heightening the height H1 of the terminal 12 for via connection, a depth of an opening 14A formed in the sealing resin 14 can be reduced to easily form the opening 14A.

The electronic components 13 are mounted on the substrate 11. As the electronic components 13, for example, passive components such as a crystal oscillator, a chip capacitor, a chip resistor or a semiconductor chip can be used.

The sealing resin 14 has the opening 14A for exposing the upper surface 12A of the terminal 12 for via connection and is disposed on the substrate 11 so as to seal the electronic components 13. The sealing resin 14 protects the electronic components 13 mounted on the substrate 11 from a shock etc. from the outside. The sealing resin 14 has good shock resistance and durability, and its surface is formed in a smooth surface, and it is difficult to roughen the surface of the sealing resin 14. As a result of that, adhesion to a conductive film formed by a sputtering method, a vacuum evaporation method, a plating method, etc. is bad and the conductive film peels off and it is difficult to directly form the conductive film (wiring pattern 18) on the sealing resin 14. As the sealing resin 14, for example, a molding resin can be used. As the molding resin, for example, an epoxy type molding resin formed by a transfer molding method can be used. More specifically, a resin in which curing agent (with filler) is included in an epoxy resin can be used. For example, the cresol novolac type epoxy resin as the epoxy resin, the phenol novolac type resin as the curing agent, the fused silica or crystalline silica as the filler can be used.

Also, the thickness M1 of the sealing resin 14 can be set at, for example, 1 mm.

The resin layer 15 is a resin layer in which adhesion to a conductive film is higher than that of the sealing resin 14 to the conductive film and roughening can be performed to the extent that the conductive film can be formed. The resin layer 15 has an opening 15A for exposing the upper surface 12A of the terminal 12 for via connection and is disposed so as to cover an upper surface 14B of the sealing resin 14. Also, the opening 15A is an opening for disposing the via 17. As the resin layer 15, for example, an epoxy type resin or a material in which metal particles used as a plating catalyst such as Pd are dispersed in an epoxy type resin can be used. More specifically, an epoxy resin in which curing agent or filler is not included, a phenol type resin, liquid crystal polymer, or polyimide resin can be used. Since the epoxy resin as the resin layer 15 dose not include the curing agent or filler, its adhesion by roughening treatment can be improved in comparison with that of the epoxy resin with the curing agent and/or filler as the sealing resin 14.

The thickness M2 of the resin layer 15 can be set at, for example, 30 μm to 60 μm.

By disposing the resin layer 15 in which adhesion to the conductive film is higher than that of the sealing resin 14 to the conductive film on the sealing resin 14 with bad adhesion to the conductive film thus, the wiring pattern 18 can be disposed on the resin layer 15 and a mounting density of the semiconductor apparatus 10 can be improved.

More specifically, since the amount of the filler component included in the molding resin is generally large (for example, more than 70 wt %), even if the roughening treatment for improvement of adhesion to the conductive film is performed to the molding resin, the adhesion structure can not be maintained because of the falling-down (collapse) of filler. For example, in a case that the conductive film is disposed on the molding resin, the peeling strength of the conductive film is 20-60 g/cm which causes the conductive film to peel off from the molding resin. In contrast, in a case that the resin layer in which adhesion to the conductive film is higher than that of the molding resin to the conductive film is disposed on the molding resin (the resin layer is adhered to the molding resin by the thermal hardening) and then the conductive film is disposed on the resin layer, the peeling strength of the conductive film is 600 g/cm or more which results in the improvement of the adhesion to the conductive film.

In addition, the conductive film also includes a seed layer. Further, an antenna may be formed instead of the wiring pattern 18. The conductive film herein means a film constructing a conductive pattern such as the wiring pattern or the antenna, or the seed layer.

The via 17 is disposed in the opening 15A formed in the resin layer 15. The via 17 is electrically connected to the terminal 12 for via connection in the lower end and is electrically connected to the wiring pattern 18 in the upper end. The via 17 can be formed by, for example, a plating method. Also, as material of the via 17, for example, Cu can be used.

The wiring pattern 18 is disposed on the resin layer 15 and has connection parts 19 for mounting other electronic components 25. By disposing the connection parts 19 for mounting the other electronic components 25 to the wiring pattern 18 thus, a mounting density of the semiconductor apparatus 10 can be improved further.

The wiring pattern 18 can be formed by patterning a conductive film formed by, for example, a sputtering method, a vacuum evaporation method or a plating method. In the case of using the sputtering method or the vacuum evaporation method, as material of the wiring pattern 18, for example, A1 can be used. Also, in the case of using the plating method, as material of the wiring pattern 18, for example, Cu can be used. Also, as the other electronic components 25, for example, passive components such as a crystal oscillator, a chip capacitor, a chip resistor or a semiconductor chip can be used.

The protective film 21 is a film having insulation properties and is disposed on the resin layer 15 so as to cover the wiring pattern 18 other than the connection parts 19. The protective film 21 is a film for protecting the wiring pattern 18 from a shock etc. from the outside. As the protective film 21, for example, a solder resist can be used.

The diffusion preventive film 23 is disposed on the connection parts 19. As the diffusion preventive film 23, for example, an Ni/Au layer (a combination layer of Ni layer disposed on the connection parts 19 and Au layer disposed on the Ni layer) can be used.

According to the semiconductor apparatus of the exemplary, non-limiting embodiment, by disposing the resin layer 15 in which adhesion to the conductive film is higher than that of the sealing resin 14 to the conductive film on the sealing resin 14 with bad adhesion to the conductive film, the wiring pattern 18 can be disposed on the resin layer 15 to improve amounting density of the semiconductor apparatus 10. Also, the mounting density can be improved further by disposing the connection parts 19 for connecting the other electronic components 25 to the wiring pattern 18.

In addition, in the exemplary, non-limiting embodiment, the via 17 may be directly connected to wiring of the substrate 11 without disposing the terminal 12 for via connection. Also, an external connection terminal connected to the wiring of the substrate 11 may be disposed in a lower surface of the substrate 11. Further, the wiring pattern 18 may be used as a lead line for electrical connection between the electronic components 13.

Figure 2:
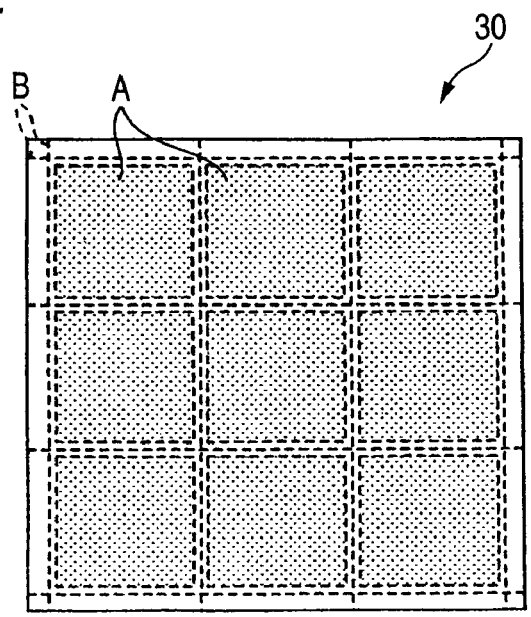
FIG. 2 is a plan view of a substrate for semiconductor apparatus formation in which the semiconductor apparatus of the exemplary, non-limiting embodiment is formed.

FIG. 2 is a plan view of a substrate for semiconductor apparatus formation in which a semiconductor apparatus of the exemplary, non-limiting embodiment is formed. In FIG. 2, A shows a region (hereinafter called "a semiconductor apparatus formation region A") in which the semiconductor apparatus 10 is formed, and B shows a position (hereinafter called "a dicing position B") in which a dicing blade cuts a substrate 30 for semiconductor apparatus formation, respectively.

Next, the substrate 30 for semiconductor apparatus formation in which the semiconductor apparatus 10 is formed will be described with reference to FIG. 2. The substrate 30 for semiconductor apparatus formation has plural semiconductor apparatus formation regions A. The substrate 11 is formed in the semiconductor apparatus formation region A of the substrate 30 for semiconductor apparatus formation. The substrate 30 for semiconductor apparatus formation is cut along the dicing positions B after a structure corresponding to the semiconductor apparatus 10 is formed as described below. As a result of this, the semiconductor apparatus 10 is divided into individual pieces and the semiconductor apparatus 10 is manufactured. As material of the substrate 30 for semiconductor apparatus formation, for example, a glass epoxy can be used.

FIGS. 3 to 16 are diagrams showing manufacturing processes of the semiconductor apparatus of the exemplary, non-limiting embodiment. In FIGS. 3 to 16, the same numerals are assigned to the same components as those of the semiconductor apparatus 10 shown in FIG. 1.

Figure 3:
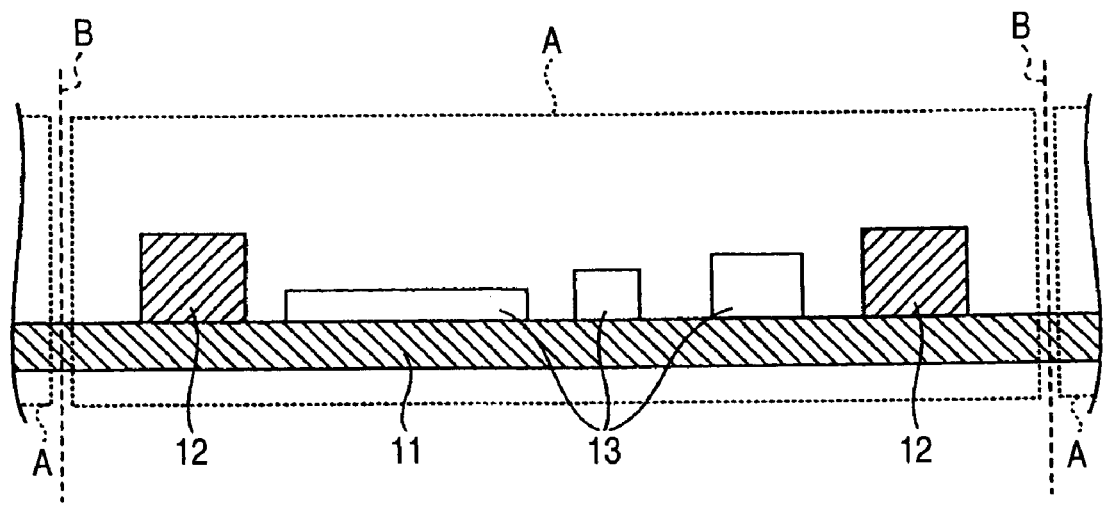
FIG. 3 is a diagram showing a manufacturing process of the semiconductor apparatus of the exemplary, non-limiting embodiment (the first).

Next, a manufacturing method of the semiconductor apparatus 10 of the exemplary, non-limiting embodiment will be described with reference to FIGS. 3 to 16. As shown in FIG. 3, terminals 12 for via connection are first formed on a substrate 11 formed in a semiconductor apparatus formation region A and subsequently, electronic components 13 are mounted on the substrate 11 (electronic component mounting process). The terminals 12 for via connection can be formed by, for example, precipitating a Cu plated film in column shape or installing a columnar Cu material.

Figure 4:
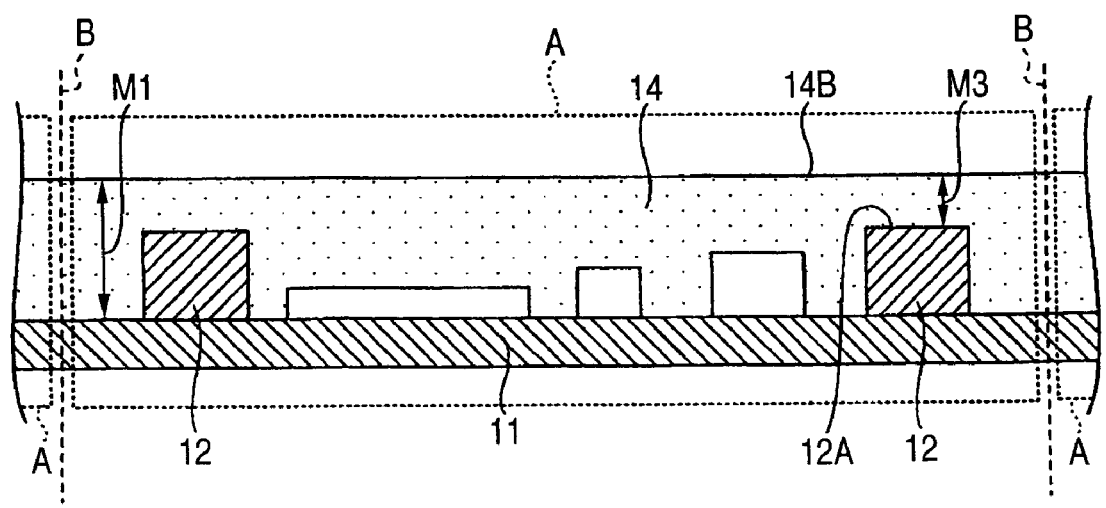
FIG. 4 is a diagram showing a manufacturing process of the semiconductor apparatus of the exemplary, non-limiting embodiment (the second).

Then, as shown in FIG. 4, a sealing resin 14 is formed on the substrate 11 so as to cover the terminals 12 for via connection and the electronic components 13 (sealing resin formation process). A thickness M1 of the sealing resin 14 can be set at, for example, 1 mm. Also, a thickness M3 of the sealing resin 14 on the terminal 12 for via connection can be set at, for example, 200 µm.

Figure 5:
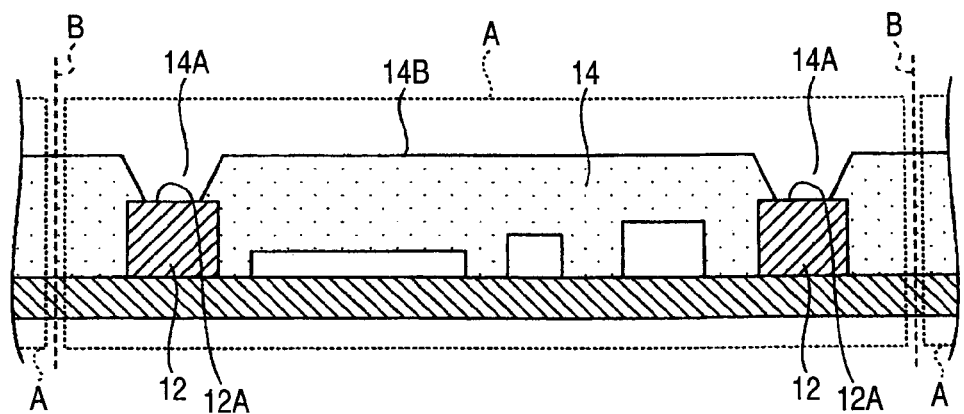
FIG. 5 is a diagram showing a manufacturing process of the semiconductor apparatus of the exemplary, non-limiting embodiment (the third).

Then, as shown in FIG. 5, openings 14A for exposing upper surfaces 12A of the terminals 12 for via connection are formed in the sealing resin 14. The openings 14A can be formed by, for example, a laser or a drill.

Figure 6:
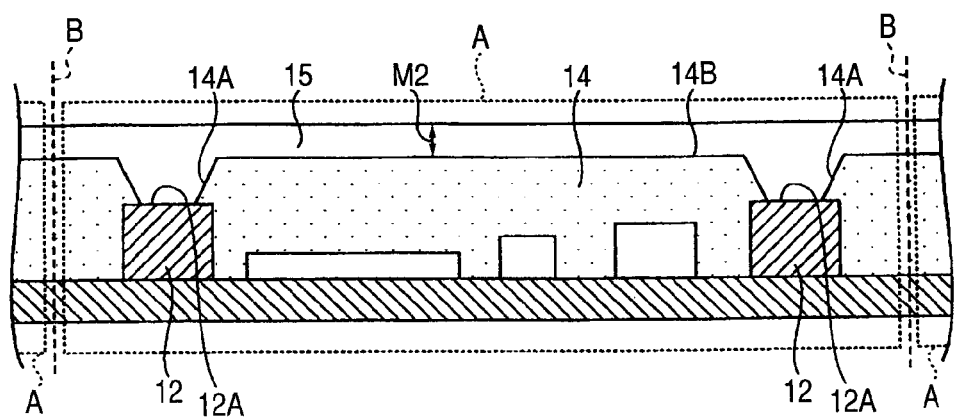
FIG. 6 is a diagram showing a manufacturing process of the semiconductor apparatus of the exemplary, non-limiting embodiment (the fourth).

Then, as shown in FIG. 6, a resin layer 15 in which adhesion to a conductive film is higher than that of the sealing resin 14 to the conductive film is formed so as to fill the openings 14A and also cover an upper surface 14B of the sealing resin 14 (resin layer formation process). As the resin layer 15, for example, an epoxy type resin or a material in which metal particles used as a plating catalyst such as Pd are dispersed in an epoxy type resin can be used. A thickness M2 of the resin layer 15 can be set at, for example, 30 µm to 60 µm.

Figure 7:
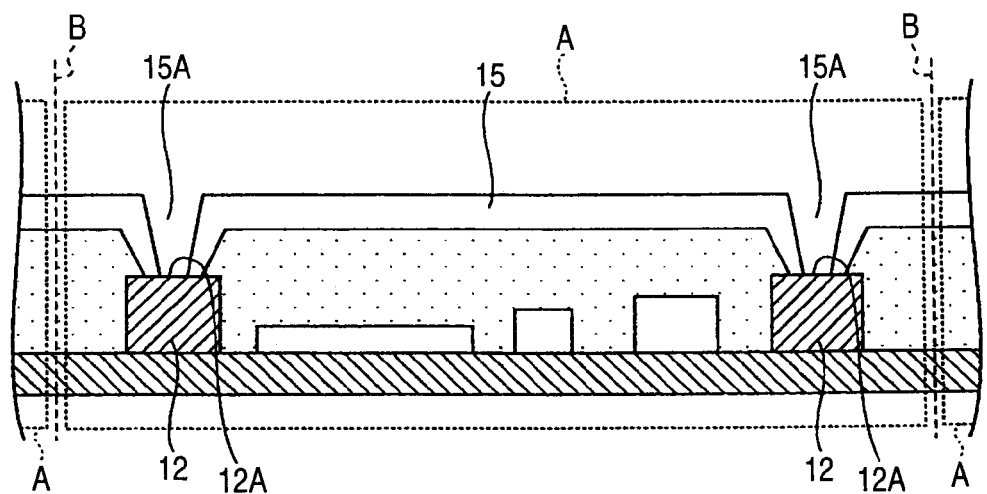
FIG. 7 is a diagram showing a manufacturing process of the semiconductor apparatus of the exemplary, non-limiting embodiment (the fifth).

Subsequently, as shown in FIG. 7, openings 15A for exposing the upper surfaces 12A of the terminals 12 for via connection are formed in the resin layer 15 and subsequently, a surface of the resin layer 15 is roughened. The openings 15A can be formed by, for example, a laser or a drill. Also, as roughening treatment of the surface of the resin layer 15, for example, desmear treatment can be used.

Figure 8:
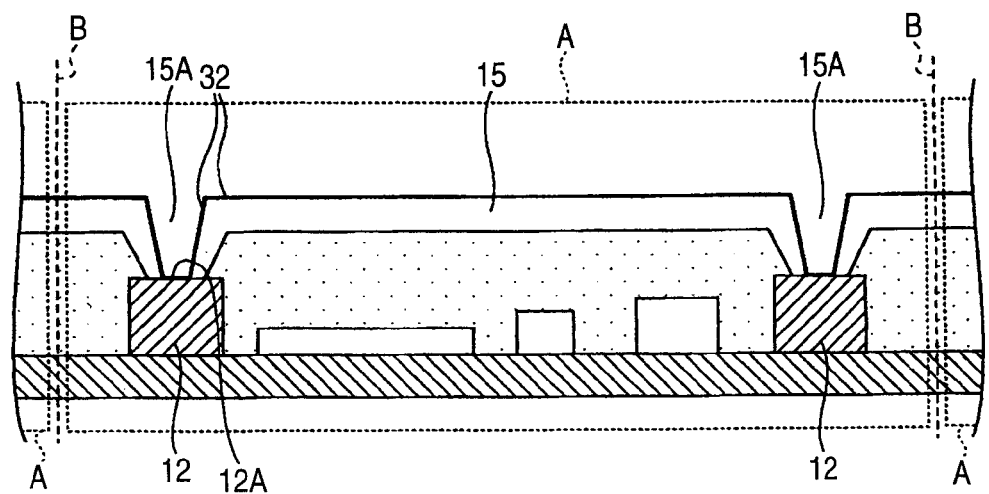
FIG. 8 is a diagram showing a manufacturing process of the semiconductor apparatus of the exemplary, non-limiting embodiment (the sixth).

Then, as shown in FIG. 8, seed layers 32 are formed so as to cover the upper surfaces 12A of the terminals 12 for via connection exposed to the openings 15A and the resin layer 15 in which the openings 15A are formed. As the seed layers 32, for example, a Cu layer formed by an electroless plating method can be used.

Figure 9:
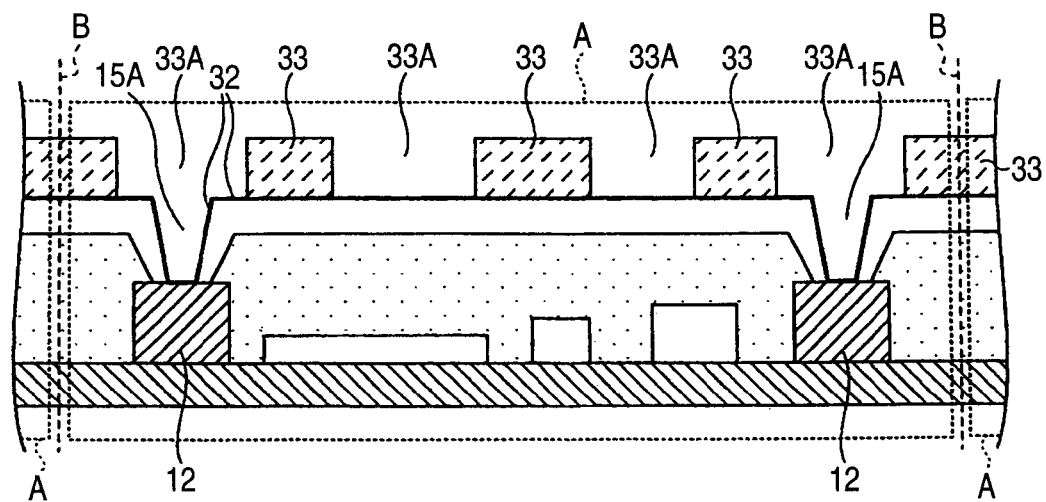
FIG. 9 is a diagram showing a manufacturing process of the semiconductor apparatus of the exemplary, non-limiting embodiment (the seventh).
Figure 10:
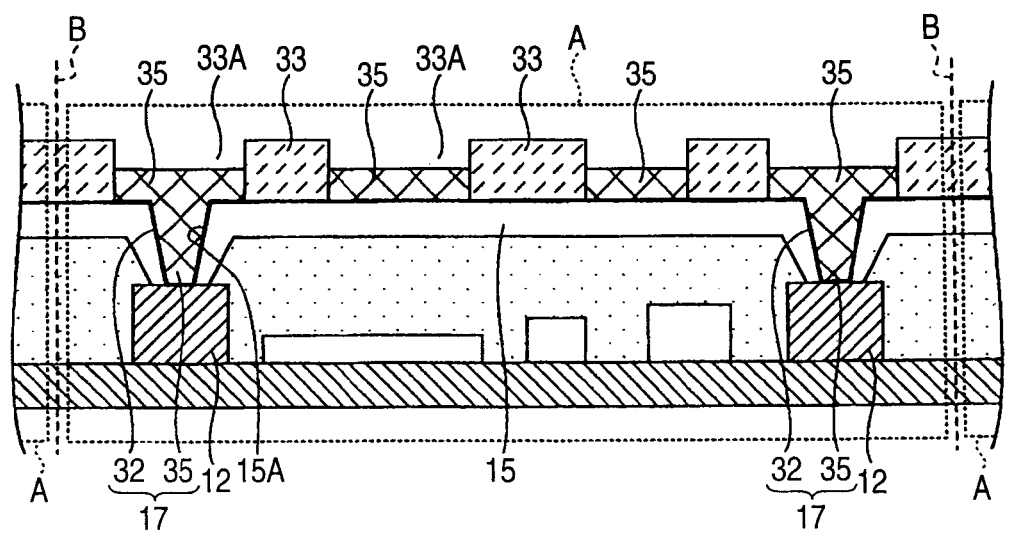
FIG. 10 is a diagram showing a manufacturing process of the semiconductor apparatus of the exemplary, non-limiting embodiment (the eighth).

Then, as shown in FIG. 9, resist layers 33 having openings 33A corresponding to a shape of a wiring pattern 18 are formed on the seed layers 32. Subsequently, as shown in FIG. 10, conductive films 35 are formed on the seed layers 32 by an electrolytic plating method. As a result of this, vias 17 made of the conductive films 35 and the seed layers 32 are formed in the openings 15A. As the conductive films 35, for example, a Cu film can be used.

Figure 11:
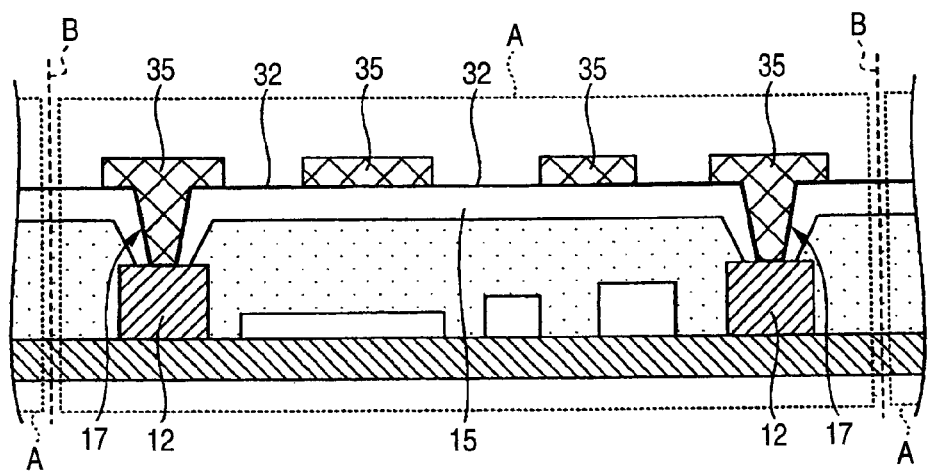
FIG. 11 is a diagram showing a manufacturing process of the semiconductor apparatus of the exemplary, non-limiting embodiment (the ninth).
Figure 12:
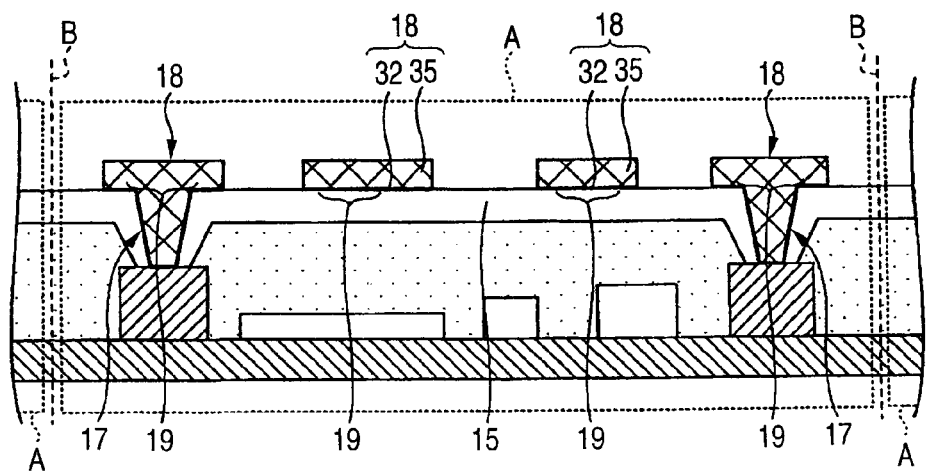
FIG. 12 is a diagram showing a manufacturing process of the semiconductor apparatus of the exemplary, non-limiting embodiment (the tenth).

Subsequently, as shown in FIG. 11, the resist layers 33 are removed by a resist stripping agent. Then, as shown in FIG. 12, unnecessary seed layers 32 which are not covered with the conductive films 35 are removed (wiring pattern formation process). As a result of this, wiring patterns 18 (including connection parts 19) made of the conductive films 35 and the seed layers 32 are formed on the resin layer 15.

Figure 13:
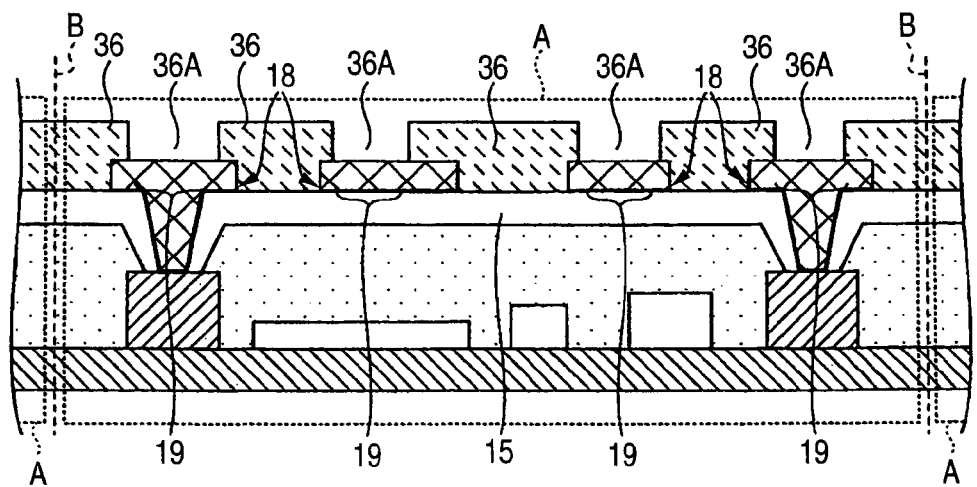
FIG. 13 is a diagram showing a manufacturing process of the semiconductor apparatus of the exemplary, non-limiting embodiment (the eleventh).

Then, as shown in FIG. 13, resist layers 36 comprising openings 36A for exposing the connection parts 19 while covering the wiring patterns 18 and the resin layer 15 are formed.

Figure 14:
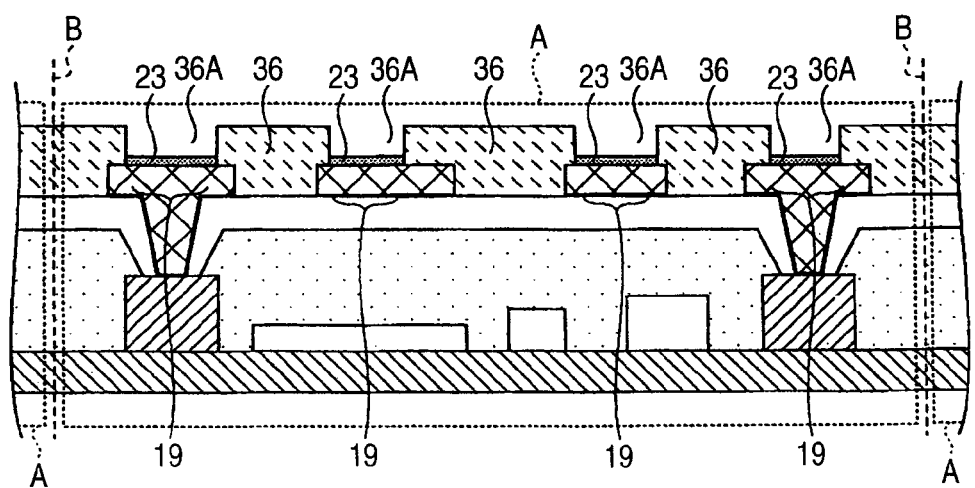
FIG. 14 is a diagram showing a manufacturing process of the semiconductor apparatus of the exemplary, non-limiting embodiment (the twelfth).

Subsequently, as shown in FIG. 14, diffusion preventive films 23 are formed on the connection parts 19. As the diffusion preventive films 23, for example, an Ni/Au layer (a combination layer of Ni layer disposed on the connection parts 19 and Au layer disposed on the Ni layer) can be used. The Ni/Au layer can be formed by, for example, an electrolytic plating method using the connection part 19 as a power feeding layer. The resist layers 36 are removed by a resist stripping agent after the diffusion preventive films 23 are formed.

Figure 15:
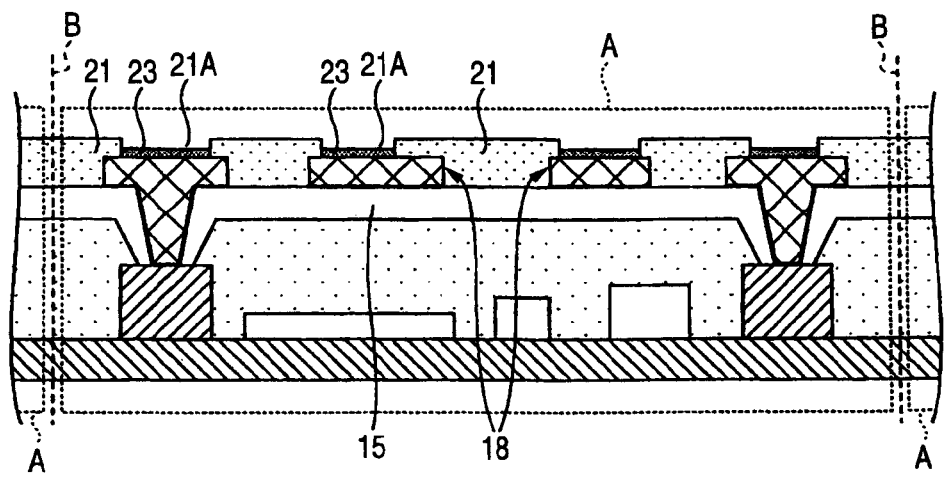
FIG. 15 is a diagram showing a manufacturing process of the semiconductor apparatus of the exemplary, non-limiting embodiment (the thirteenth).

Then, as shown in FIG. 15, protective films 21 comprising openings 21A for exposing the diffusion preventive films 23 while covering the wiring patterns 18 and the resin layer 15 are formed (protective film formation process). The protective films 21 have films having insulation properties. As the protective films 21, for example, a solder resist can be used.

Figure 16:
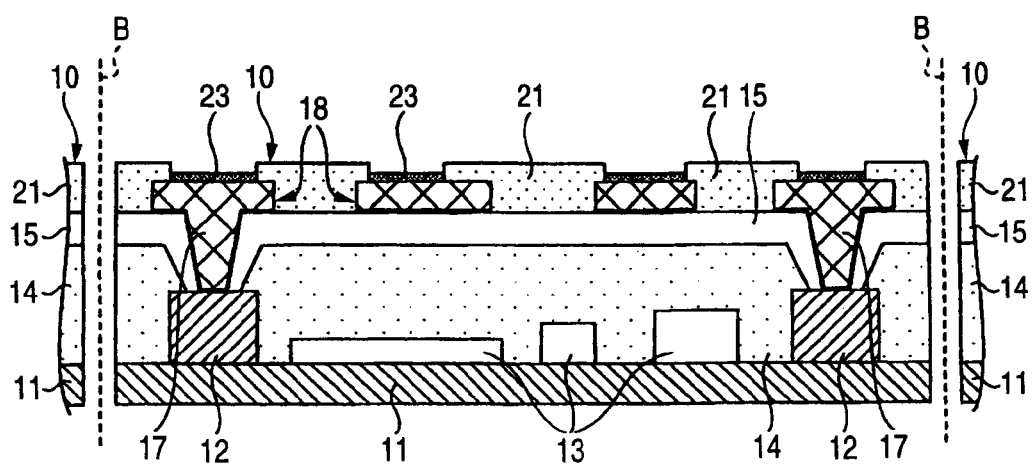
FIG. 16 is a diagram showing a manufacturing process of the semiconductor apparatus of the exemplary, non-limiting embodiment (the fourteenth).

Then, as shown in FIG. 16, a structure shown in FIG. 15 is cut along dicing positions B and is divided into individual pieces and thereby, the semiconductor apparatus 10 is manufactured.

According to the manufacturing method of the semiconductor apparatus of the exemplary, non-limiting embodiment, the wiring patterns 18 can be formed on the resin layer 15 by disposing a resin layer formation process of forming the resin layer 15 in which adhesion to the conductive films 35 is higher than that of the sealing resin 14 to the conductive films on the sealing resin 14 on which it is difficult to form the conductive films 35.

Second Embodiment

Figure 17:
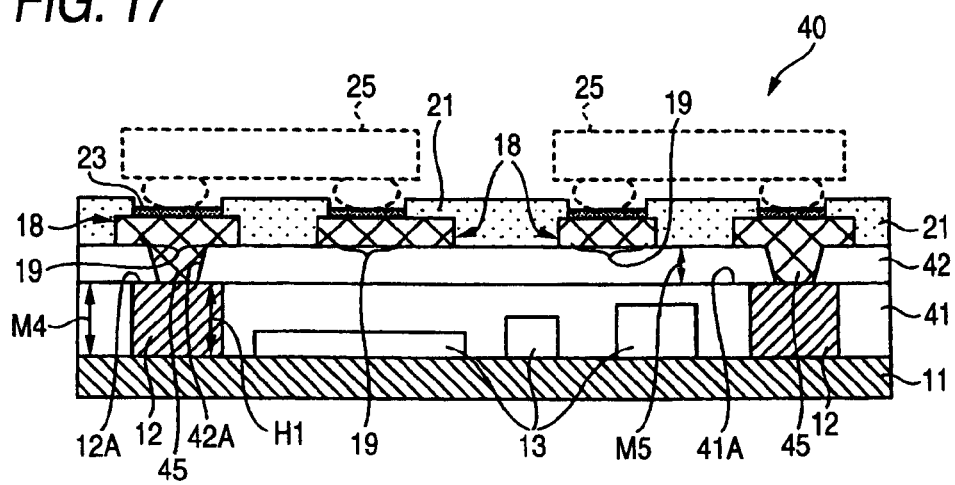
FIG. 17 is a sectional view of a semiconductor apparatus according to a second exemplary, non-limiting embodiment of the invention.

FIG. 17 is a sectional view of a semiconductor apparatus according to a second exemplary, non-limiting embodiment of the invention. In FIG. 17, M4 shows a thickness (hereinafter called "thickness M4") of a sealing resin 41, and M5 shows a thickness (herein after called "thickness M5") of a resin layer 42, respectively. Also, in FIG. 17, the same numerals are assigned to the same components as those of the semiconductor apparatus 10 of the first exemplary, non-limiting embodiment.

First, a semiconductor apparatus 40 according to the exemplary, non-limiting embodiment of the invention will be described with reference to FIG. 17. The semiconductor apparatus 40 has a configuration similar to that of the semiconductor apparatus 10 except that a sealing resin 41, a resin layer 42 and vias 45 are disposed instead of the sealing resin 14, the resin layer 15 and the vias 17 disposed in the semiconductor apparatus 10 of the first exemplary, non-limiting embodiment.

The sealing resin 41 is a resin having properties similar to those of the sealing resin 14 described in the first exemplary, non-limiting embodiment and is a resin with bad adhesion to a conductive film. The sealing resin 41 is disposed on a substrate 11 so as to seal electronic components 13. Also, an upper surface 41A of the sealing resin 41 is formed substantially flush with upper surfaces 12A of terminals 12 for via connection. That is, the thickness M4 of the sealing resin 41 is constructed so as to become substantially equal to a height H1 of the terminal 12 for via connection. As the sealing resin 41, a resin similar to the sealing resin 14 described in the first exemplary, non-limiting embodiment can be used.

By forming the upper surface 41A of the sealing resin 41 substantially flush with the upper surfaces 12A of the terminals 12 for via connection thus, the thickness M4 of the sealing resin 41 can be thinned to achieve miniaturization (thinning) of the semiconductor apparatus 40.

The resin layer 42 is a resin layer in which adhesion to a conductive film is higher than that of the sealing resin 41 to the conductive film and roughening can be performed to the extent that the conductive film can be formed. The resin layer 42 has an opening 42A for exposing the upper surface 12A of the terminal 12 for via connection and is disposed so as to cover an upper surface 41A of the sealing resin 41. As the resin layer 42, a resin similar to the resin layer 15 described in the first exemplary, non-limiting embodiment can be used. In addition, the conductive film also includes a seed layer. Further, an antenna may be formed instead of the wiring pattern 18. The conductive film herein means a film constructing a conductive pattern such as the wiring pattern or the antenna, or the seed layer.

The vias 45 are disposed in the openings 42A formed in the resin layer 42, and make electrical connection between wiring patterns 18 and the terminals 12 for via connection.

According to the semiconductor apparatus of the exemplary, non-limiting embodiment, by disposing the resin layer 42 in which adhesion to the conductive film is higher than that of the sealing resin 41 to the conductive film on the sealing resin 41 and forming the wiring patterns 18 on the resin layer 42, a mounting density of the semiconductor apparatus 40 can be improved and also, the thickness M4 of the sealing resin 41 can be thinned to achieve miniaturization of the semiconductor apparatus 40.

In addition, an external connection terminal connected to the wiring of the substrate 11 may be disposed in a lower surface of the substrate 11. Also, the wiring pattern 18 may be used as a lead line for electrical connection between the electronic components 13.

FIGS. 18 to 22 are diagrams showing manufacturing processes of the semiconductor apparatus of the exemplary, non-limiting embodiment. In FIGS. 18 to 22, the same numerals are assigned to the same components as those of the semiconductor apparatus 40 described in FIG. 17. Also, in FIGS. 18 to 22, A1 shows a region (hereinafter called "a semiconductor apparatus formation region A1") in which the semiconductor apparatus 40 is formed, and B1 shows a position (hereinafter called "a dicing position B1") in which a dicing blade cuts, respectively.

Next, a manufacturing method of the semiconductor apparatus 40 of the exemplary, non-limiting embodiment will be described with reference to FIGS. 18 to 22.

First, processing similar to that of FIGS. 3 and 4 described in the first exemplary, non-limiting embodiment is performed, and electronic components 13 are mounted on a substrate 11 on which terminals 12 for via connection are formed (electronic component mounting process), and a sealing resin 41 is formed so as to cover the terminals 12 for via connection and the electronic components 13 (sealing resin formation process).

Figure 18:
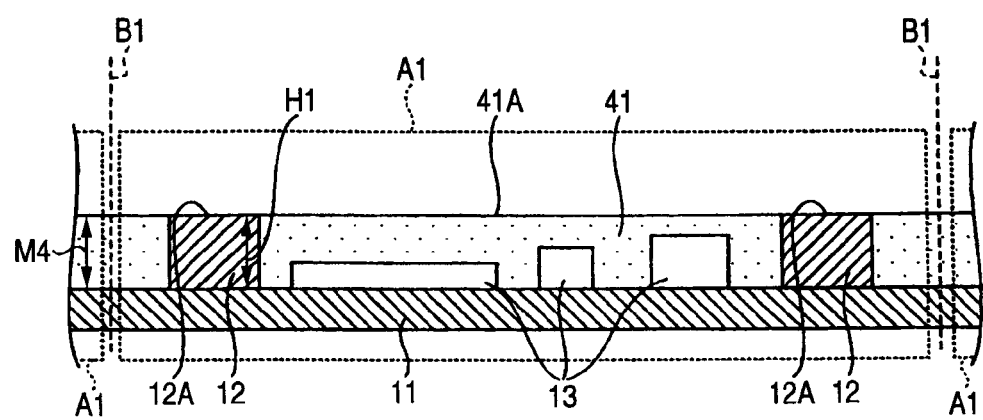
FIG. 18 is a diagram showing a manufacturing process of the semiconductor apparatus of the exemplary, non-limiting embodiment (the first).

Subsequently, as shown in FIG. 18, the sealing resin 41 is polished so that an upper surface 41A of the sealing resin 41 becomes flush with upper surfaces 12A of the terminals 12 for via connection (M4=H1).

Figure 19:
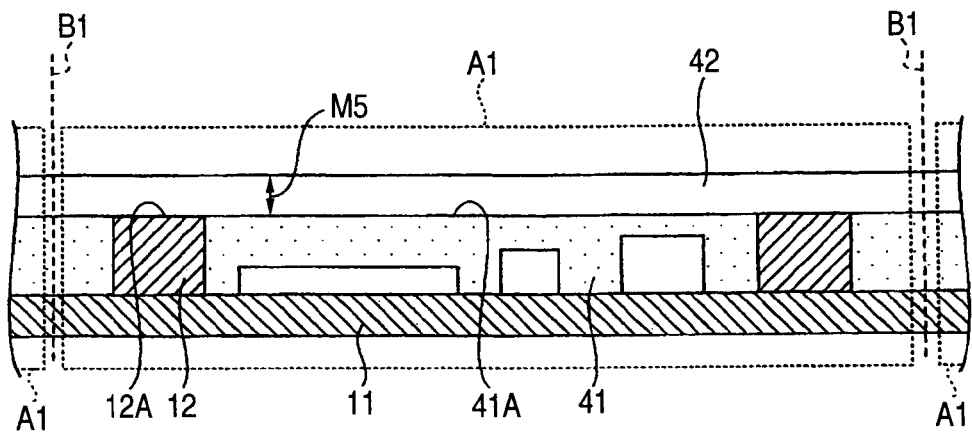
FIG. 19 is a diagram showing a manufacturing process of the semiconductor apparatus of the exemplary, non-limiting embodiment (the second).

Then, as shown in FIG. 19, a resin layer 42 in which adhesion to a conductive film is higher than that of the sealing resin 41 to the conductive film is formed so as to cover the upper surface 41A of the sealing resin 41 and the upper surfaces 12A of the terminals 12 for via connection (resin layer formation process). A thickness M5 of the resin layer 42 can be set at, for example, 30 µm to 60 µm.

Figure 20:
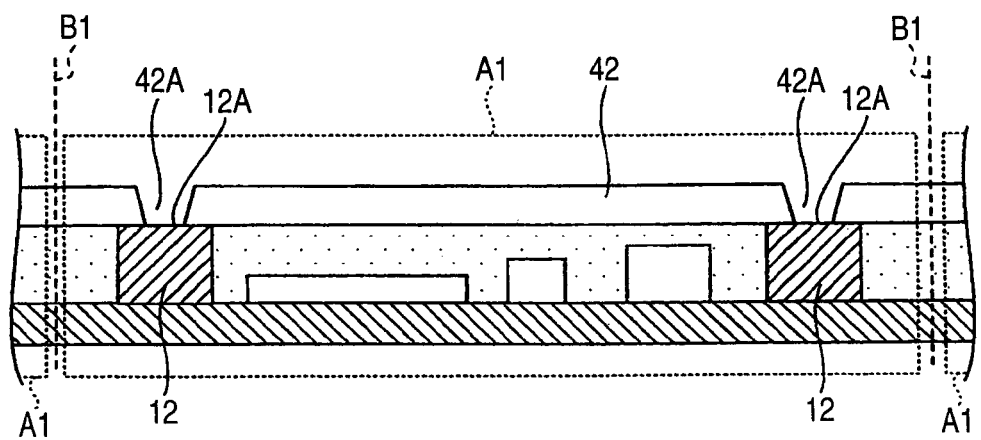
FIG. 20 is a diagram showing a manufacturing process of the semiconductor apparatus of the exemplary, non-limiting embodiment (the third).

Then, as shown in FIG. 20, openings 42A for exposing the upper surfaces 12A of the terminals 12 for via connection are formed in the resin layer 42 and thereafter, a surface of the resin layer 42 in which the openings 42A are formed is roughened. The openings 42A can be formed by, for example, a laser or a drill. Also, as roughening treatment of the surface of the resin layer 42, for example, desmear treatment can be used.

Figure 21:
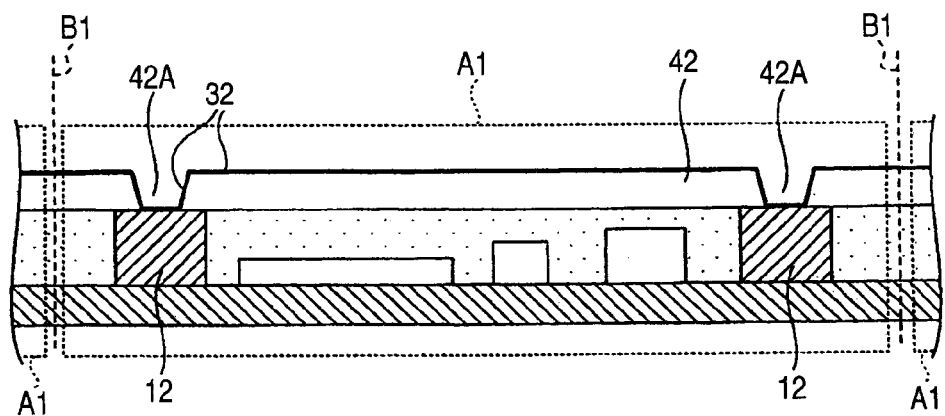
FIG. 21 is a diagram showing a manufacturing process of the semiconductor apparatus of the exemplary, non-limiting embodiment (the fourth).

Then, as shown in FIG. 21, seed layers 32 are formed so as to cover the upper surfaces 12A of the terminals 12 for via connection exposed to the openings 42A and the resin layer 42 in which the openings 42A are formed. As the seed layers 32, for example, a Cu layer formed by an electroless plating method can be used.

Figure 22:
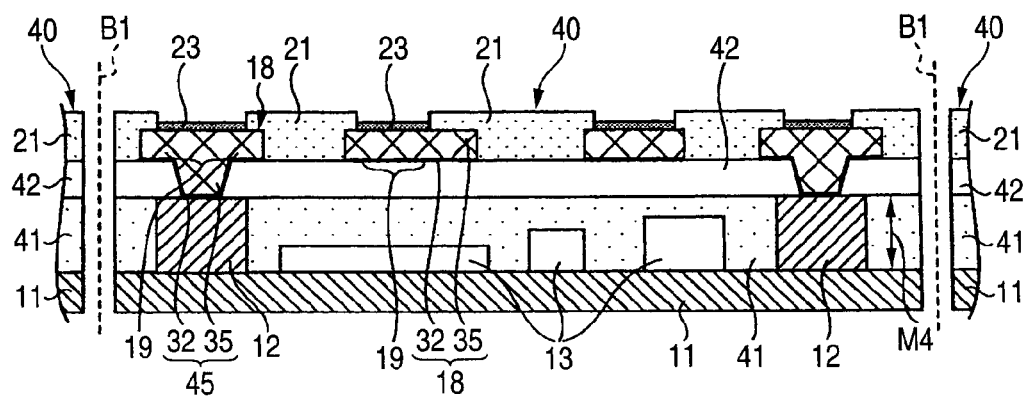
FIG. 22 is a diagram showing a manufacturing process of the semiconductor apparatus of the exemplary, non-limiting embodiment (the fifth).

Subsequently, by performing processing similar to the processes (including the wiring pattern formation process and the protective film formation process) of FIGS. 9 to 16 described in the first exemplary, non-limiting embodiment, the semiconductor apparatus 40 comprising vias 45 made of conductive films 35 and the seed layers 32 is manufactured as shown in FIG. 22.

According to the manufacturing method of the semiconductor apparatus of the exemplary, non-limiting embodiment, by polishing the sealing resin 41 so that the upper surface 41A of the sealing resin 41 becomes flush with the upper surfaces 12A of the terminals 12 for via connection, the thickness M4 of the sealing resin 41 can be thinned to achieve miniaturization of the semiconductor apparatus 40.

Third Embodiment

Figure 23:
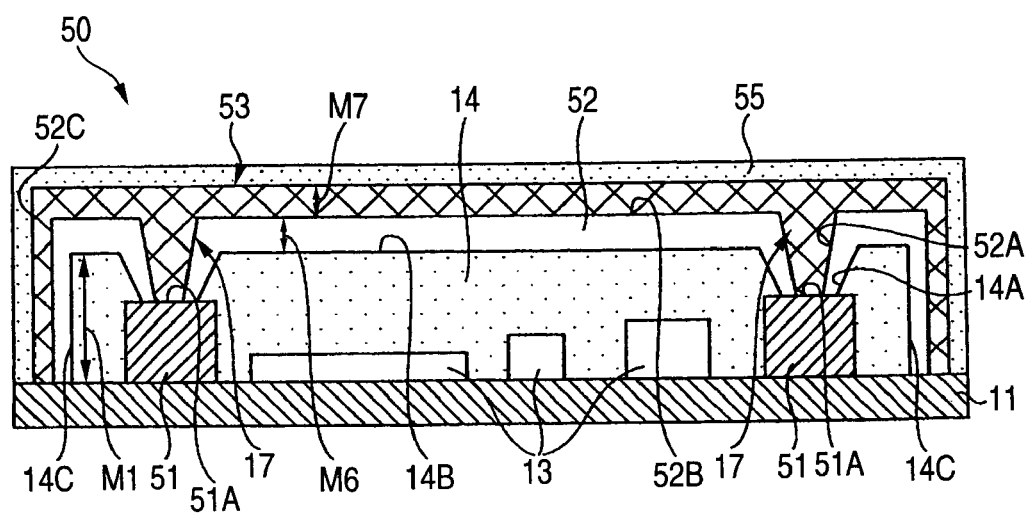
FIG. 23 is a sectional view of a semiconductor apparatus according to a third exemplary, non-limiting embodiment of the invention.

FIG. 23 is a sectional view of a semiconductor apparatus according to a third exemplary, non-limiting embodiment of the invention. In FIG. 23, M6 shows a thickness (hereinafter called "thickness M6") of a resin layer 52, and M7 shows a thickness (hereinafter called "thickness M7") of a shielding layer 53, respectively. Also, in FIG. 23, the same numerals are assigned to the same components as those of the semiconductor apparatus 10 of the first exemplary, non-limiting embodiment.

A semiconductor apparatus 50 according to the exemplary, non-limiting embodiment of the invention will be described with reference to FIG. 23. The semiconductor apparatus 50 has a substrate 11, electronic components 13, a sealing resin 14, a via 17, a ground terminal 51, the resin layer 52, the shielding layer 53 and a protective film 55.

The ground terminal 51 is a terminal set at a ground potential and is disposed on the substrate 11. The ground terminal 51 is electrically connected to the shielding layer 53 through the via 17.

The resin layer 52 is a resin layer in which adhesion to a conductive film is higher than that of the sealing resin 14 to the conductive film and roughening can be performed to the extent that the conductive film can be formed. The resin layer 52 has openings 52A for exposing upper surfaces 51A of the ground terminals 51 and is disposed so as to cover an upper surface 14B and side surfaces 14C of the sealing resin 14. As the resin layer 52, a resin similar to the resin layer 15 described in the first exemplary, non-limiting embodiment can be used. The thickness M6 of the resin layer 52 can be set at, for example, 30 µm to 60 µm. In addition, the conductive film also includes a seed layer. The conductive film herein means a film constructing the shielding layer or the seed layer.

By disposing the resin layer 52 in which adhesion to the conductive film is higher than that of the sealing resin 14 to the conductive film so as to continuously cover the upper surface 14B and the side surfaces 14C of the sealing resin 14 thus, the shielding layer 53 can be formed so as to continuously surround the upper surface 14B and the side surfaces 14C of the sealing resin 14.

The shielding layer 53 is disposed on the resin layer 52 so as to continuously surround the upper surface 14B and the side surfaces 14C of the sealing resin 14. The shielding layer 53 is electrically connected to the vias 17 and is electrically connected to the ground terminals 51 through the vias 17.

By disposing the shielding layer 53 so as to surround the upper surface 14B and the side surfaces 14C of the sealing resin 14 for sealing the electronic components 13 thus, electromagnetic waves intruding from the sides of the side surfaces 14C of the sealing resin 14 can be blocked and the electromagnetic waves from the outside can be blocked with high accuracy.

The shielding layer 53 can be formed by forming a conductive film formed by, for example, a sputtering method, a vacuum evaporation method or a plating method. In the case of using the sputtering method or the vacuum evaporation method, as material of the shielding layer 53, for example, Al can be used. Also, in the case of using the plating method, as material of the shielding layer 53, for example, Cu can be used. The thickness M7 of the shielding layer 53 can be set at, for example, 10 µm to 30 µm.

The protective film 55 is a film having insulation properties and is disposed so as to cover the shielding layer 53. The protective film 55 is a film for protecting the shielding layer 53. As the protective film 55, for example, a solder resist can be used.

According to the semiconductor apparatus of the exemplary, non-limiting embodiment, the electromagnetic waves from the outside can be blocked with high accuracy by disposing the resin layer 52 in which adhesion to the conductive film is higher than that of the sealing resin 14 to the conductive film and roughening can be performed to the extent that the conductive film can be formed so as to cover the sealing resin 14 in which it is difficult to form the conductive film (metal film) and disposing the shielding layer 53 on the resin layer 52 so as to continuously surround the upper surface 14B and the side surfaces 14C of the sealing resin 14. In addition, the shielding layer 53 and the resin layer 52 may be disposed in only the side of the upper surface 14B of the sealing resin 14. Also, an external connection terminal connected to the wiring of the substrate 11 may be disposed in a lower surface of the substrate 11. Further, a substrate comprising a shielding layer in the inside could be used as the substrate 11. Also, the vias 17 may be directly connected to a part of the wiring for ground of the substrate 11 without disposing the ground terminals 51.

FIGS. 24 to 34 are diagrams showing manufacturing processes of the semiconductor apparatus of the exemplary, non-limiting embodiment. In FIGS. 24 to 34, A2 shows a region (hereinafter called "a semiconductor apparatus formation region A2") in which a semiconductor apparatus 50 is formed, and B2 shows a position (hereinafter called "a dicing position B2") cut by a dicing blade, respectively. Also, in FIGS. 24 to 34, the same numerals are assigned to the same components as those of the semiconductor apparatus 50 shown in FIG. 23.

Figure 24:
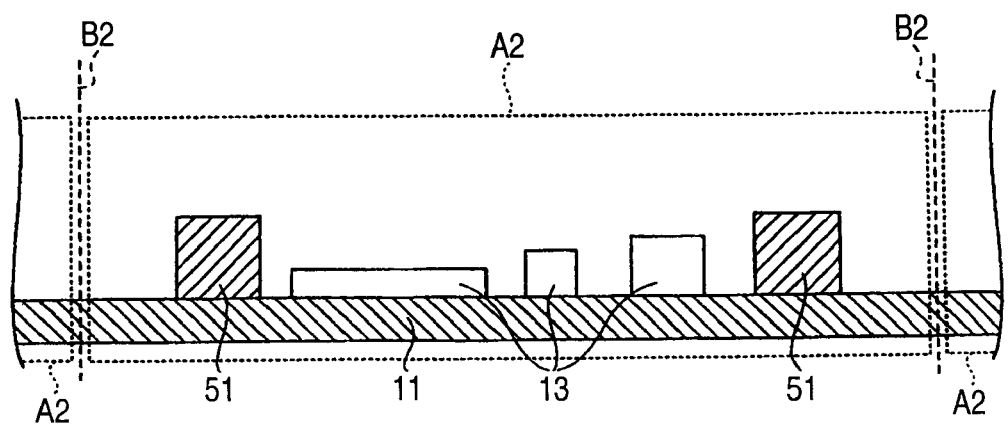
FIG. 24 is a diagram showing a manufacturing process of the semiconductor apparatus of the exemplary, non-limiting embodiment (the first).

Next, a manufacturing method of the semiconductor apparatus 50 of the exemplary, non-limiting embodiment will be described with reference to FIGS. 24 to 34. As shown in FIG. 24, ground terminals 51 are first formed on a substrate 11 corresponding to the semiconductor apparatus formation region A2 (ground terminal formation process) and subsequently, electronic components 13 are mounted on the substrate 11 (electronic component mounting process)

Figure 25:
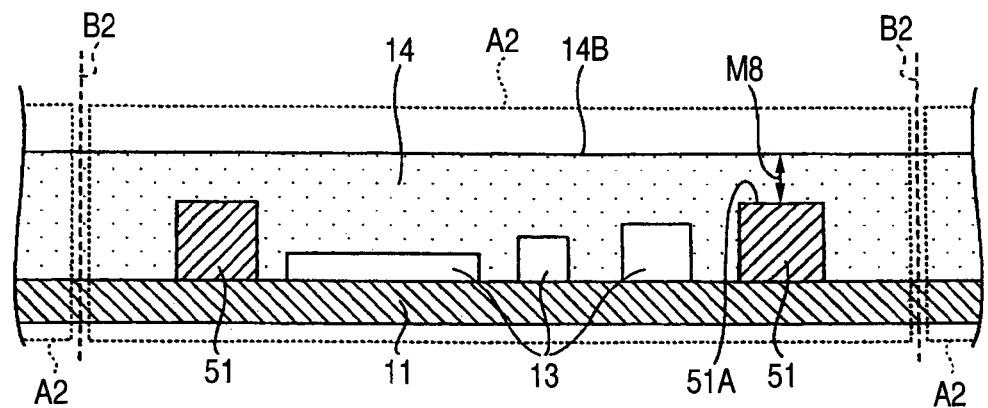
FIG. 25 is a diagram showing a manufacturing process of the semiconductor apparatus of the exemplary, non-limiting embodiment (the second).

Then, as shown in FIG. 25, a sealing resin 14 is formed on the substrate 11 so as to cover the ground terminals 51 and the electronic components 13 (sealing resin formation process). A thickness M8 (thickness ranging from an upper surface 51A of the ground terminal 51 to an upper surface 14B of the sealing resin 14) of the sealing resin 14 can be set at, for example, 200 μm.

Figure 26:
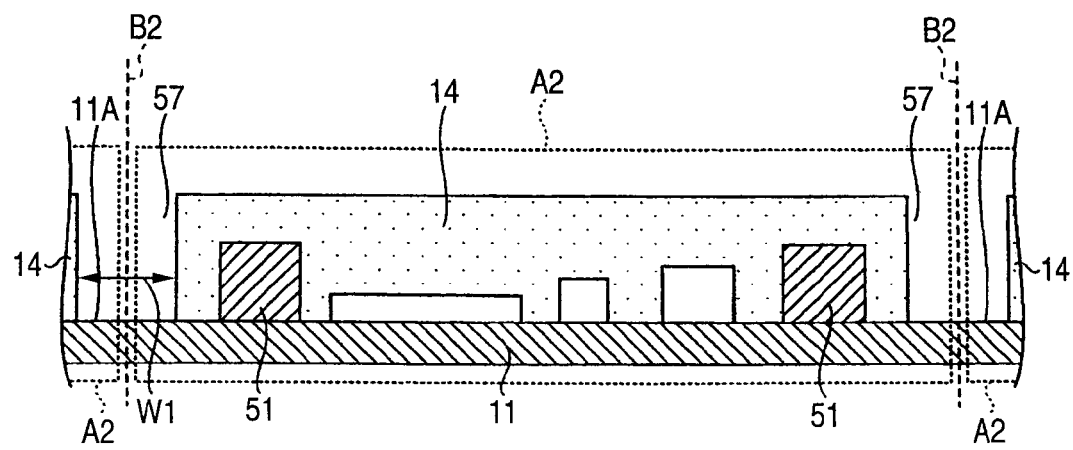
FIG. 26 is a diagram showing a manufacturing process of the semiconductor apparatus of the exemplary, non-limiting embodiment (the third).

Then, as shown in FIG. 26, a groove part 57 for exposing the substrate 11 is formed in the sealing resin 14 corresponding to the dicing position B2. The groove part 57 can be formed by, for example, cutting by the dicing blade. A width W1 of the groove part 57 can be set at, for example, 0.5 mm.

Figure 27:
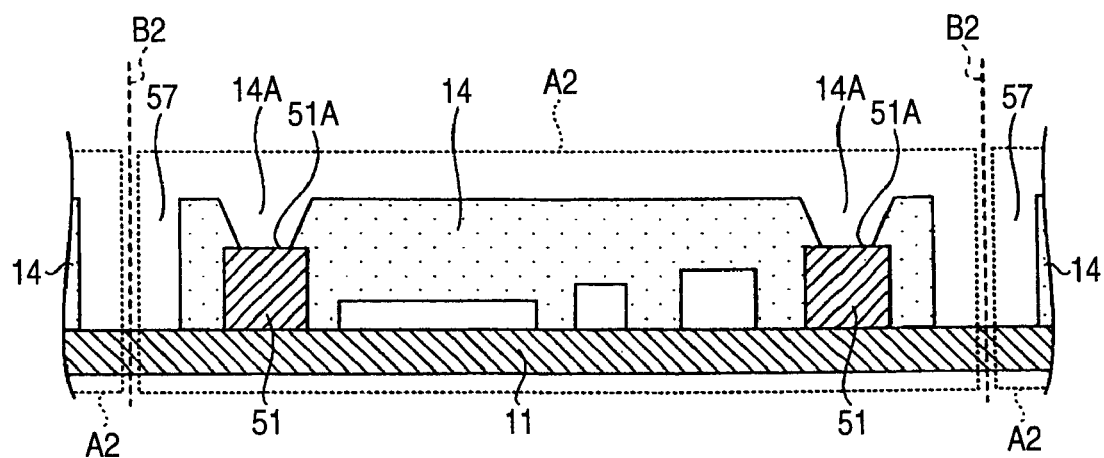
FIG. 27 is a diagram showing a manufacturing process of the semiconductor apparatus of the exemplary, non-limiting embodiment (the fourth).
Figure 28:
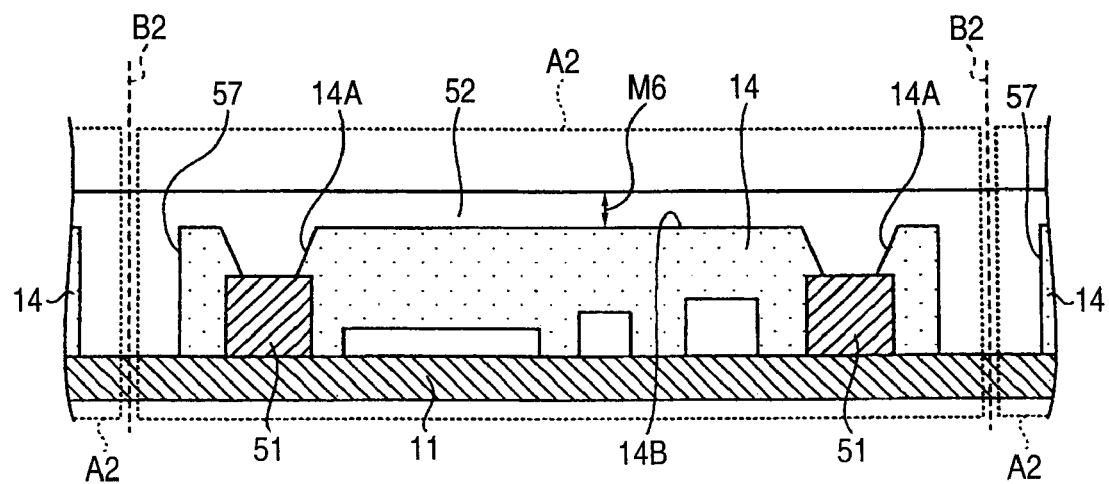
FIG. 28 is a diagram showing a manufacturing process of the semiconductor apparatus of the exemplary, non-limiting embodiment (the fifth).

Then, as shown in FIG. 27, openings 14A for exposing the upper surfaces 51A of the ground terminals 51 are formed. Then, as shown in FIG. 28, a resin layer 52 in which adhesion to a conductive film is higher than that of the sealing resin 14 to the conductive film is formed so as to cover the upper surface 14B of the sealing resin 14 while filling the openings 14A and the groove part 57 (resin layer formation process).

Figure 29:
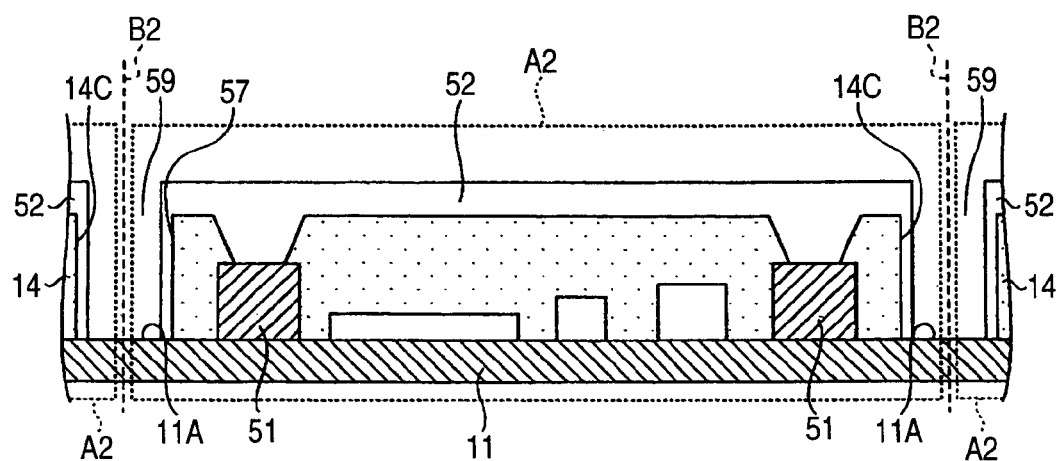
FIG. 29 is a diagram showing a manufacturing process of the semiconductor apparatus of the exemplary, non-limiting embodiment (the sixth).

Subsequently, as shown in FIG. 29, a groove part 59 for exposing an upper surface 11A of the substrate 11 is formed in the resin layer 52 with which the groove part 57 is filled. In this case, the groove part 59 is formed so that the resin layer 52 remains in side surfaces 14C of the sealing resin 14 (a state of covering the side surfaces 14C of the sealing resin 14 with the resin layer 52). The groove part 59 can be formed by, for example, cutting by the dicing blade.

Figure 30:
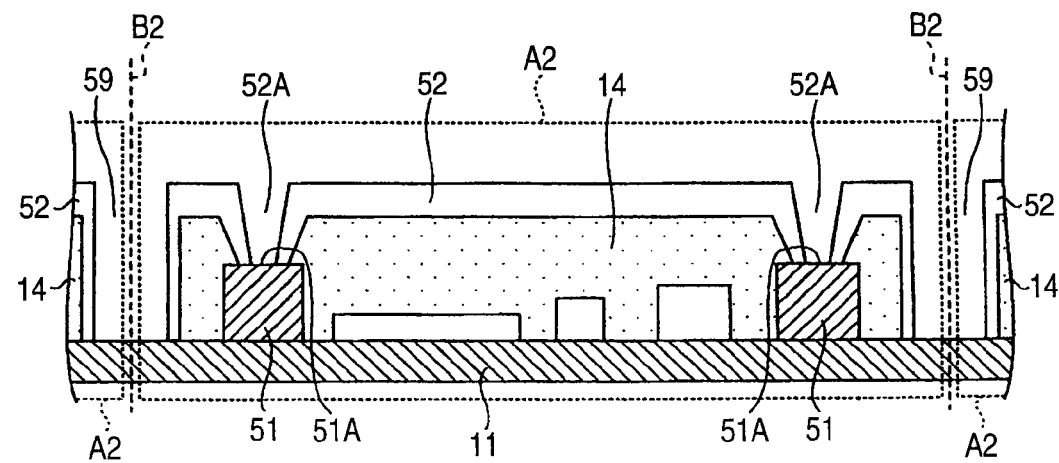
FIG. 30 is a diagram showing a manufacturing process of the semiconductor apparatus of the exemplary, non-limiting embodiment (the seventh).

Then, as shown in FIG. 30, openings 52A for exposing the upper surfaces 51A of the ground terminals 51 are formed in the resin layer 52 and thereafter, a surface of the resin layer 52 is roughened. The openings 52A can be formed by, for example, a laser or a drill. Also, as roughening treatment of the surface of the resin layer 52, for example, desmear treatment can be used.

Figure 31:
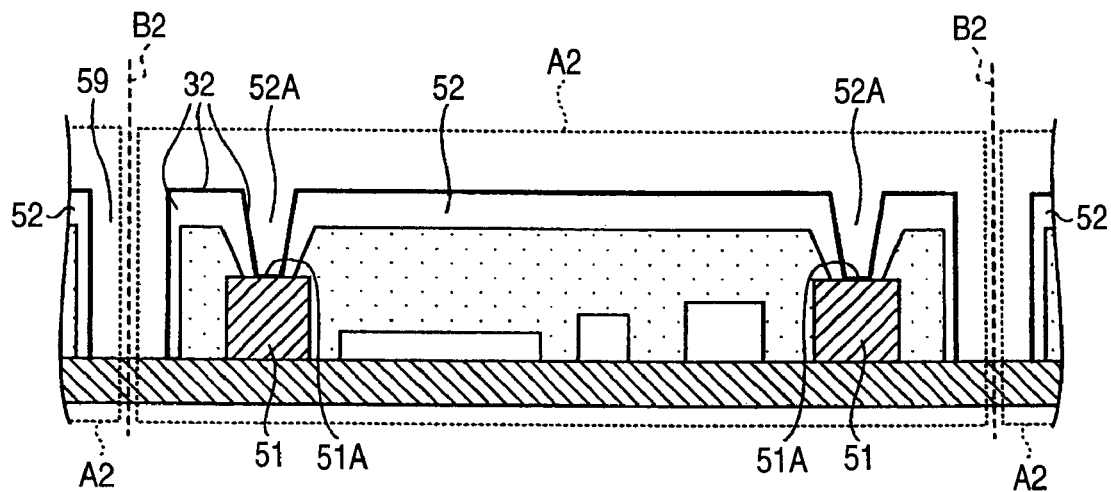
FIG. 31 is a diagram showing a manufacturing process of the semiconductor apparatus of the exemplary, non-limiting embodiment (the eighth).

Then, as shown in FIG. 31, seed layers 32 are formed so as to cover the resin layer 52 and the upper surfaces 51A of the ground terminals 51 exposed to the openings 52A. The seed layers 32 are power feeding layers in the case of performing electrolytic plating. As the seed layers 32, for example, a Cu layer formed by an electroless plating method can be used.

Figure 32:
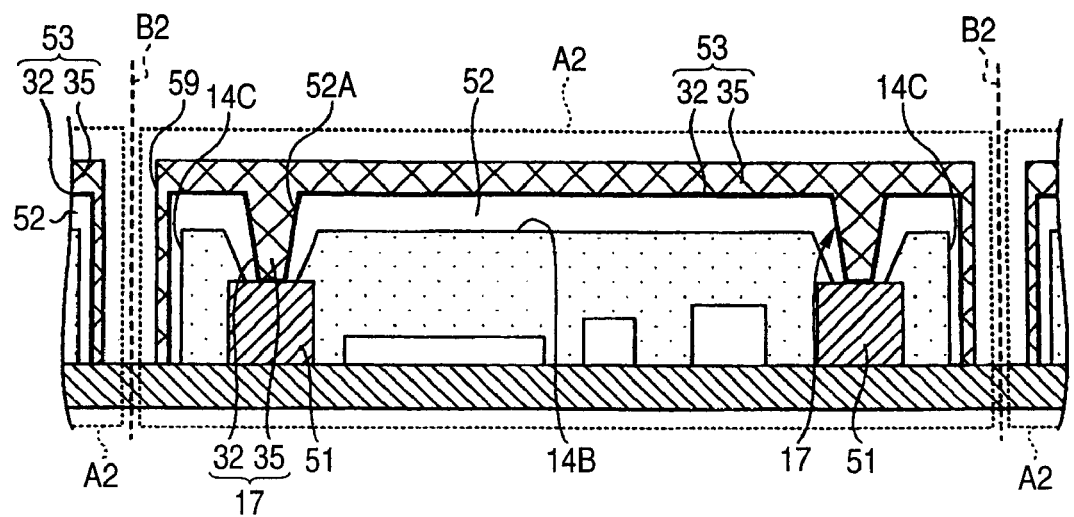
FIG. 32 is a diagram showing a manufacturing process of the semiconductor apparatus of the exemplary, non-limiting embodiment (the ninth).

Then, as shown in FIG. 32, a conductive film 35 is formed on the seed layers 32. As a result of this, vias 17 and a shielding layer 53 for surrounding the upper surface 14B and the side surfaces 14C of the sealing resin 14 are formed in the openings 52A (shielding layer formation process). The shielding layer 53 and the vias 17 are made of the seed layer 32 and the conductive film 35, respectively. As the conductive film 35, for example, a Cu film formed by an electrolytic plating method can be used.

Figure 33:
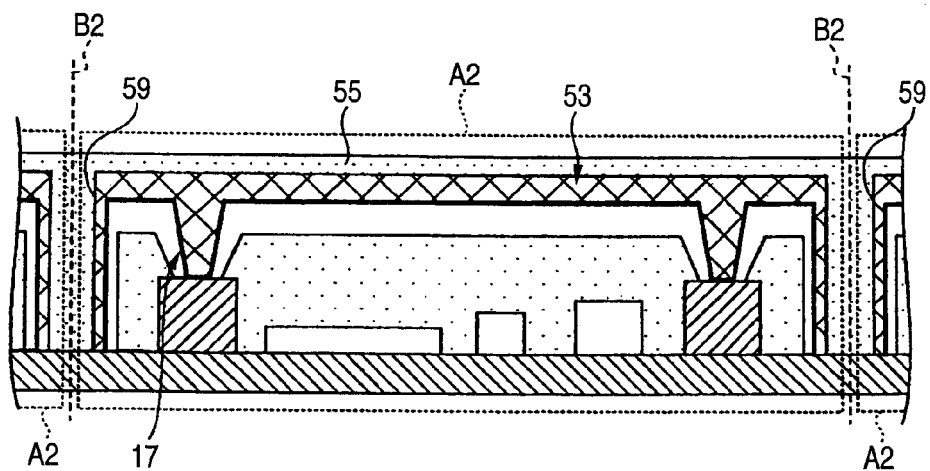
FIG. 33 is a diagram showing a manufacturing process of the semiconductor apparatus of the exemplary, non-limiting embodiment (the tenth).

Subsequently, as shown in FIG. 33, a protective film 55 is formed so as to cover the shielding layer 53 while filling the groove part 59 (protective film formation process). As a result of this, a structure corresponding to the semiconductor apparatus 50 is formed in the semiconductor apparatus formation region A2. The protective film 55 is a film having insulation properties and protects the shielding layer 53. As the protective film 55, for example, a solder resist can be used.

Figure 34:
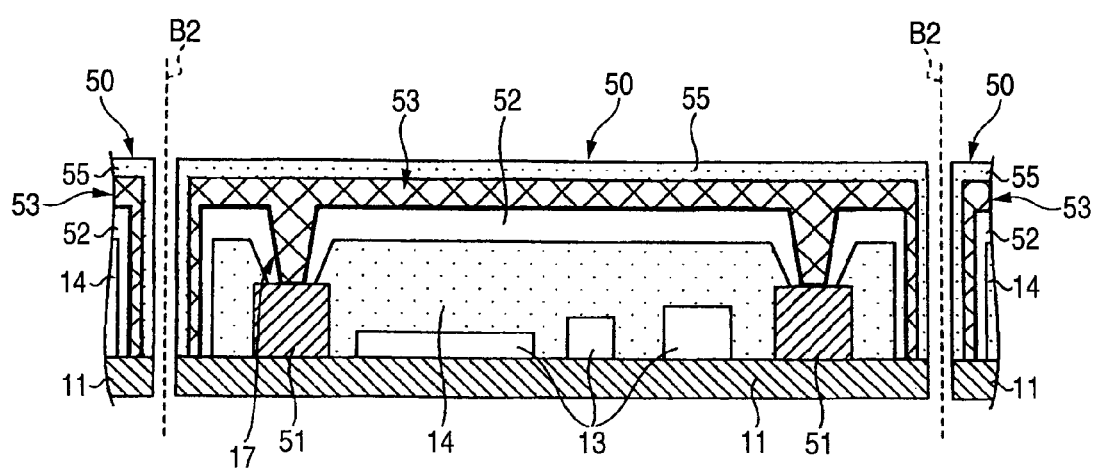
FIG. 34 is a diagram showing a manufacturing process of the semiconductor apparatus of the exemplary, non-limiting embodiment (the eleventh).

Then, as shown in FIG. 34, the structure shown in FIG. 33 is cut along the dicing positions B2 and is divided into individual pieces and thereby, the semiconductor apparatus 50 is manufactured.

According to the manufacturing method of the semiconductor apparatus of the exemplary, non-limiting embodiment, the shielding layer 53 can be formed on the resin layer 52 with high accuracy by forming the resin layer 52 in which adhesion to the conductive film is higher than that of the sealing resin 14 to the conductive film so as to cover the sealing resin 14 on which it is difficult to form the conductive film.

Also, by forming the resin layer 52 so as to cover the upper surface 14B and the side surfaces 14C of the sealing resin 14, the shielding layer 53 is formed so as to surround the upper surface 14B and the side surfaces 14C of the sealing resin 14 and electromagnetic waves can be blocked with high accuracy.

In addition, in the manufacturing method of the semiconductor apparatus of the exemplary, non-limiting embodiment, the case of forming the shielding layer 53 by a plating method has been described as an example, but the shielding layer 53 may be formed by forming an Al layer by, for example, a sputtering method or a vacuum evaporation method. Also, the shielding layer 53 may be disposed in only the resin layer 52 disposed in the side of the upper surface 14B of the sealing resin 14.

Fourth Embodiment

Figure 35:
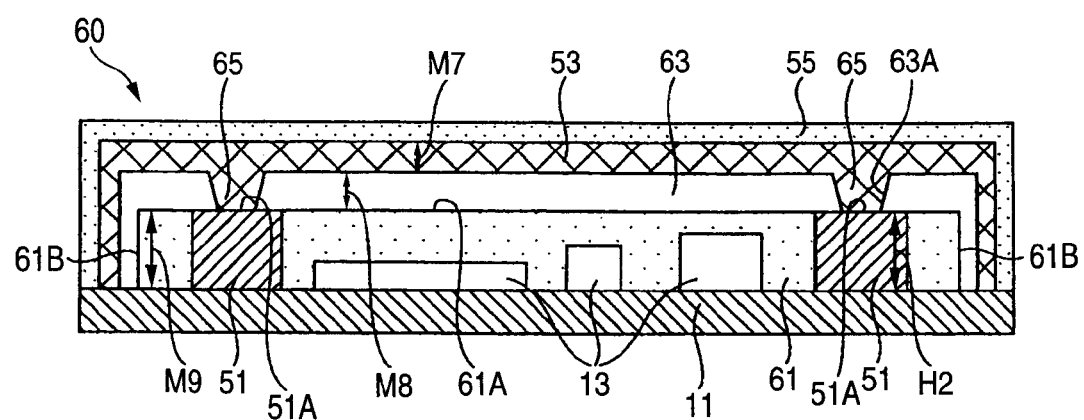
FIG. 35 is a sectional view of a semiconductor apparatus according to a fourth exemplary, non-limiting embodiment of the invention.

FIG. 35 is a sectional view of a semiconductor apparatus of a fourth exemplary, non-limiting embodiment. In FIG. 35, H2 shows a height (hereinafter called "height H2") of a ground terminal 51, and M8 shows a thickness (hereinafter called "thickness M8") of a resin layer 63, and M9 shows a thickness (hereinafter called "thickness M9") of a sealing resin 61, respectively. Also, in FIG. 35, the same numerals are assigned to the same components as those of the semiconductor apparatus 50 of the third exemplary, non-limiting embodiment.

First, a semiconductor apparatus 60 according to the exemplary, non-limiting embodiment of the invention will be described with reference to FIG. 35. The semiconductor apparatus 60 has a configuration similar to that of the semiconductor apparatus 50 except that a sealing resin 61, a resin layer 63 and vias 65 are disposed instead of the sealing resin 14, the resin layer 52 and the vias 17 disposed in the semiconductor apparatus 50 of the third exemplary, non-limiting embodiment.

The sealing resin 61 is disposed on a substrate 11 so as to seal electronic components 13. An upper surface 61A of the sealing resin 61 is formed substantially flush with upper surfaces 51A of ground terminals 51. Also, the thickness M9 of the sealing resin 61 is formed substantially equally to the height H2 of the ground terminal 51.

By forming the upper surface 61A of the sealing resin 61 substantially flush with the upper surfaces 51A of the ground terminals 51 and thinning the thickness M9 of the sealing resin 61 thus, miniaturization (thinning) of the semiconductor apparatus 60 can be achieved. In addition, as the sealing resin 61, a resin similar to the sealing resin 14 described in the first exemplary, non-limiting embodiment can be used.

The resin layer 63 has an opening 63A for exposing the upper surface 51A of the ground terminal 51 and is disposed so as to cover the upper surface 61A and side surfaces 61B of the sealing resin 61. The resin layer 63 is a resin layer in which adhesion to a conductive film is higher than that of the sealing resin 61 to the conductive film and roughening can be performed to the extent that the conductive film can be formed. As the resin layer 63, a resin similar to the resin layer 15 described in the first exemplary, non-limiting embodiment can be used. In addition, the conductive film also includes a seed layer. The conductive film herein means a film constructing the shielding layer or the seed layer.

The vias 65 are disposed in the openings 63A formed in the resin layer 63. The vias 65 make electrical connection between a shielding layer 53 and the ground terminals 51.

According to the semiconductor apparatus of the exemplary, non-limiting embodiment, electromagnetic waves from the outside are blocked with high accuracy and also the upper surface 61A of the sealing resin 61 is formed substantially flush with the upper surfaces 51A of the ground terminals 51 and the thickness M9 of the sealing resin 61 is thinned and thereby, miniaturization of the semiconductor apparatus 60 can be achieved. In addition, the shielding layer 53 and the resin layer 63 may be disposed in only the side of the upper surface 61A of the sealing resin 61. Also, an external connection terminal connected to the wiring of the substrate 11 may be disposed in a lower surface of the substrate 11. Further, a substrate comprising a shielding layer in the inside could be used as the substrate 11.

FIGS. 36 to 41 are diagrams showing manufacturing processes of the semiconductor apparatus of the exemplary, non-limiting embodiment. In FIGS. 36 to 41, A3 shows a region (hereinafter called "a semiconductor apparatus formation region A3") in which a semiconductor apparatus 60 is formed, and B3 shows a position (hereinafter called "a dicing position B3") cut by a dicing blade, respectively. Also, in FIGS. 36 to 41, the same numerals are assigned to the same components as those of the semiconductor apparatus 50 described in FIG. 35.

Next, a manufacturing method of the semiconductor apparatus 60 of the exemplary, non-limiting embodiment will be described with reference to FIGS. 36 to 41. First, processing similar to that of FIGS. 24 and 25 described in the third exemplary, non-limiting embodiment is performed and ground terminals 51 are formed on a substrate 11 (ground terminal formation process) and subsequently, electronic components 13 are mounted on the substrate 11 (electronic component mounting process). Thereafter, a sealing resin 61 is formed on the substrate 11 so as to cover the ground terminals 51 and the electronic components 13 (sealing resin formation process).

Figure 36:
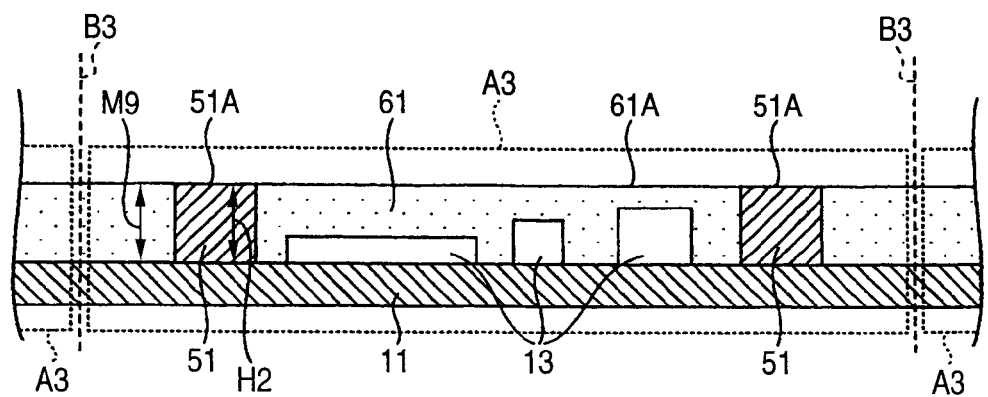
FIG. 36 is a diagram showing a manufacturing process of the semiconductor apparatus of the exemplary, non-limiting embodiment (the first).

Subsequently, as shown in FIG. 36, the sealing resin 61 is polished so that an upper surface 61A of the sealing resin 61 becomes flush with upper surfaces 51A of the ground terminals 51.

Figure 37:
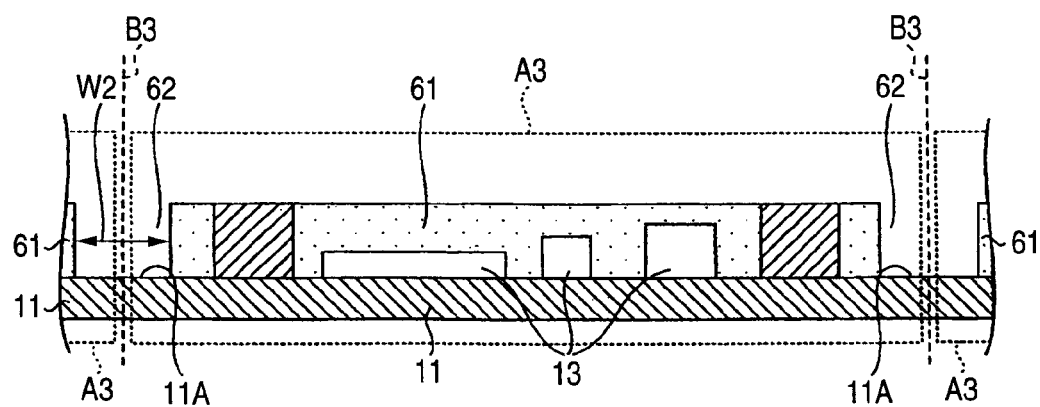
FIG. 37 is a diagram showing a manufacturing process of the semiconductor apparatus of the exemplary, non-limiting embodiment (the second).

Then, as shown in FIG. 37, a groove part 62 for exposing an upper surface 11A of the substrate 11 is formed in the sealing resin 61 corresponding to the dicing position B3. The groove part 62 can be formed by, for example, cutting by the dicing blade. A width W2 of the groove part 62 can be set at, for example, 0.5 mm.

Figure 38:
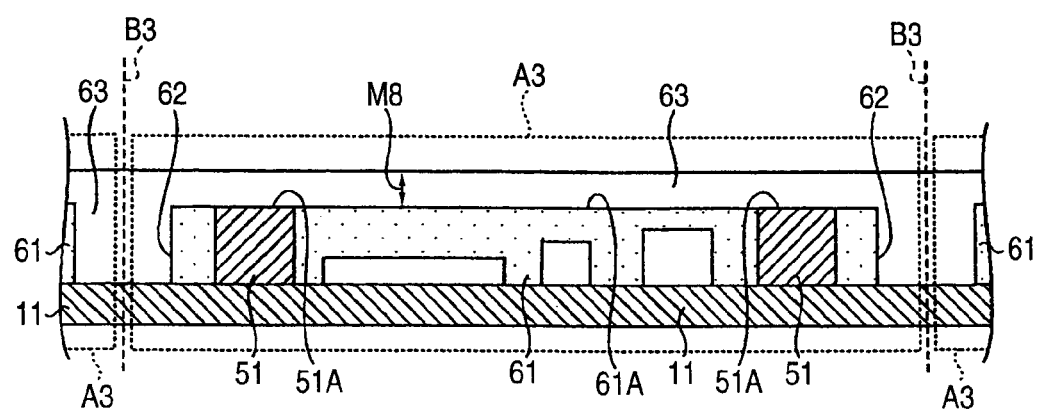
FIG. 38 is a diagram showing a manufacturing process of the semiconductor apparatus of the exemplary, non-limiting embodiment (the third).

Then, as shown in FIG. 38, a resin layer 63 in which adhesion to a conductive film is higher than that of the sealing resin 61 to the conductive film is formed so as to cover the upper surface 61A of the sealing resin 61 while filling the groove part 62 (resin layer formation process). As the resin layer 63, a resin similar to the resin layer 15 described in the first exemplary, non-limiting embodiment can be used. Also, the thickness M8 of the resin layer 63 can be set at, for example, 30 μm to 60 μm.

Figure 39:
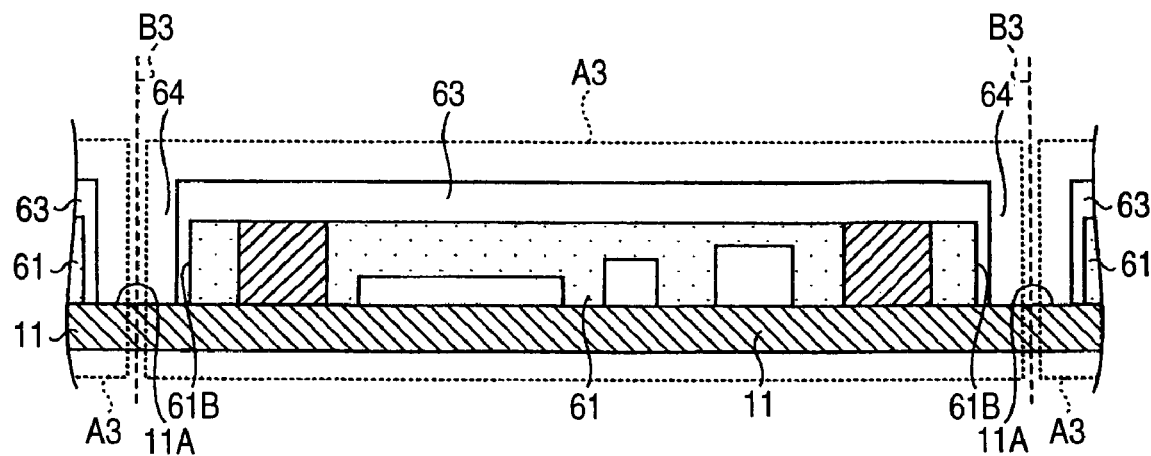
FIG. 39 is a diagram showing a manufacturing process of the semiconductor apparatus of the exemplary, non-limiting embodiment (the fourth).

Then, as shown in FIG. 39, a groove part 64 for exposing the upper surface 11A of the substrate 11 is formed in the resin layer 63 with which the groove part 62 of the sealing resin 61 is filled. In this case, the groove part 64 is formed so that the resin layer 63 remains in side surfaces 61B of the sealing resin 61 (a state of covering the side surfaces 61B of the sealing resin 61 with the resin layer 63). The groove part 64 can be formed by, for example, cutting by the dicing blade.

Figure 40:
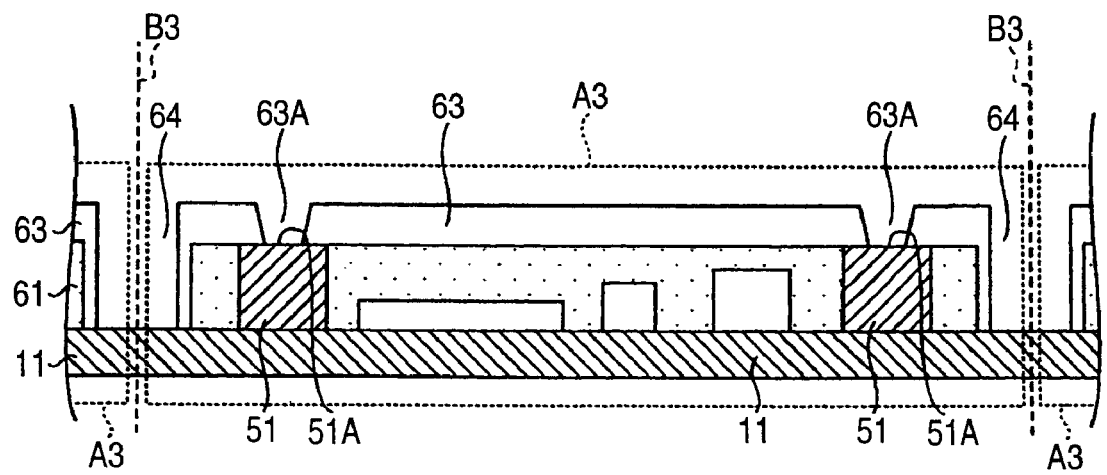
FIG. 40 is a diagram showing a manufacturing process of the semiconductor apparatus of the exemplary, non-limiting embodiment (the fifth).

Then, as shown in FIG. 40, openings 63A for exposing the upper surfaces 51A of the ground terminals 51 are formed in the resin layer 63 and thereafter, a surface of the resin layer 63 is roughened. The openings 63A can be formed by, for example, a laser or a drill. Also, as roughening treatment of the surface of the resin layer 63, for example, desmear treatment can be used.

Figure 41:
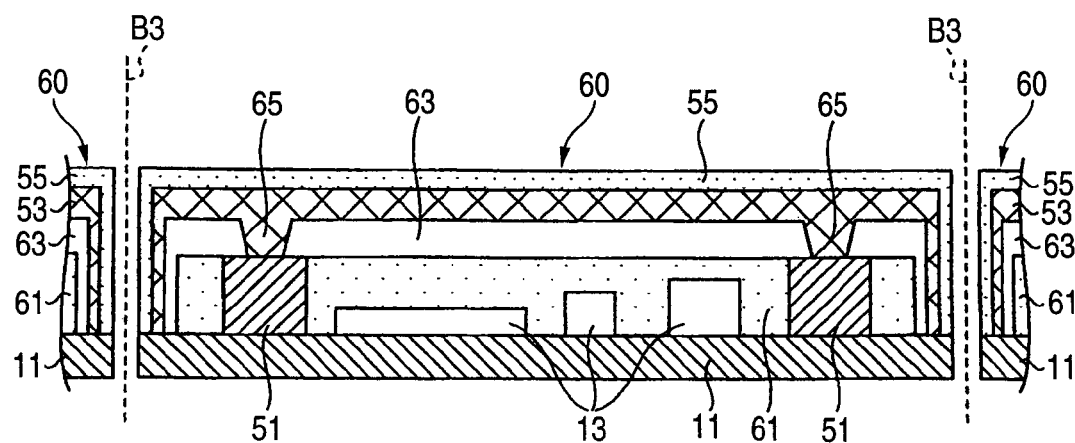
FIG. 41 is a diagram showing a manufacturing process of the semiconductor apparatus of the exemplary, non-limiting embodiment (the sixth).
Figure 42:
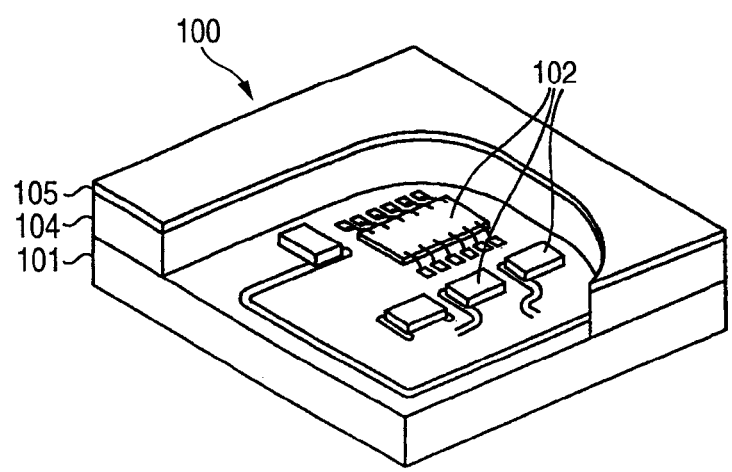
FIG. 42 is a perspective view of a related-art semiconductor apparatus comprising a shielding layer and a sealing resin for sealing electronic components.

Subsequently, by performing the processing (including the shielding layer formation process and the protective film formation process) of FIGS. 31 to 34 described in the third exemplary, non-limiting embodiment, the semiconductor apparatus 60 is manufactured as shown in FIG. 41.

According to the manufacturing method of the semiconductor apparatus of the exemplary, non-limiting embodiment, while the shielding layer 53 can be formed with high accuracy, the sealing resin 61 is polished so that the upper surface 61A of the sealing resin 61 becomes flush with the upper surfaces 51A of the ground terminals 51 and thereby, the thickness M9 of the sealing resin 61 can be thinned to achieve miniaturization of the semiconductor apparatus 60.

In addition, the shielding layer 53 may be disposed in only the resin layer 63 disposed in the side of the upper surface 61A of the sealing resin 61.

The preferred embodiments of the invention have been described above in detail, but the invention is not limited to such particular embodiments, and various modifications and changes can be made within the gist of the invention described in the claims.

According to the disclosure described above, it can be applied to a semiconductor apparatus capable of improving a mounting density and blocking electromagnetic waves with high accuracy, and a manufacturing method of the semiconductor apparatus.

We claim:

1. A semiconductor apparatus comprising:
   a substrate;
   an electronic component mounted on said substrate;
   a sealing resin for sealing said electronic component;
   a resin layer disposed directly on the sealing resin, said resin layer having an adhesion to a conductive film which is higher than an adhesion of said sealing resin to the conductive film; and
   a conductive pattern electrically connected to the electronic component and disposed on the resin layer,
   wherein the substrate has an electrode, which electrically connects the conductive pattern and the electronic component, and wherein at least a part of the resin layer is in contact with the electrode.

2. The semiconductor apparatus as claimed in claim 1, wherein the conductive pattern has a connection part for connecting other electronic component.

3. The semiconductor apparatus as claimed in claim 2, further comprising: a protective film for covering the conductive pattern with the connection part exposed.

4. A semiconductor apparatus comprising:
   a substrate;
   an electronic component mounted on said substrate;
   a sealing resin for sealing said electronic component;
   a resin layer disposed directly on the sealing resin, said resin layer having an adhesion to a conductive film which is higher than an adhesion of said sealing resin to the conductive film; and
   a conductive pattern electrically connected to the electronic component and disposed on the resin layer,
   wherein the substrate has an electrode, which electrically connects the conductive pattern and the electronic component, and wherein the electrode is electrically connected to the conductive pattern through a via, which is provided in the resin layer and passes through the resin layer.

5. The semiconductor apparatus as claimed in claim 4, wherein the conductive pattern has a connection part for connecting other electronic component.

* * * * *